United States Patent [19]
Okuma et al.

[11] Patent Number: 6,054,898
[45] Date of Patent: Apr. 25, 2000

[54] SEMICONDUCTOR DEVICE HAVING SEPP CONNECTED NPN AND PNP TRANSISTORS

[75] Inventors: Tatsuhiko Okuma, Yokohama; Akira Miyamoto, Fusa; Hachiro Sato, Kawasaki, all of Japan

[73] Assignees: Kabushiki Kaisha Kenwood, Tokyo; Sanken Denki Kabushiki Kaisha, Saitama, both of Japan

[21] Appl. No.: 08/859,710

[22] Filed: May 21, 1997

[30] Foreign Application Priority Data

Aug. 30, 1996 [JP] Japan ................................. 8-248545

[51] Int. Cl.[7] .................................................... H03F 3/26
[52] U.S. Cl. ............................................ 330/266; 330/267
[58] Field of Search .................................. 330/263, 266, 330/267, 268, 307

[56] References Cited

U.S. PATENT DOCUMENTS 4,523,154   6/1985   Congdon ................................. 330/266
5,337,012   8/1994   Dijkmans ........................... 330/267 X

FOREIGN PATENT DOCUMENTS 0102907   8/1980   Japan ..................................... 330/267

*Primary Examiner*—Steven J. Mottola
*Attorney, Agent, or Firm*—Eric J. Robinson; Nixon Peabody LLP

[57] ABSTRACT

A semiconductor device capable of maintaining good temperature compensation and reducing manufacture costs of SEPP connecting NPN and PNP power transistors and temperature compensating and biasing circuits. A first semiconductor device has an ordinary bias diode formed on the same semiconductor substrate as an NPN power transistor. A second semiconductor device has one or a plurality of Schottky barrier type diodes formed on the same semiconductor substrate as a PNP power transistor. The forward voltage drop $V_1$ of the diode is set to an arbitrary constant value smaller than E exclusive of about E/2, and the total forward voltage drop $V_2$ of the Schottky barrier diode or diodes is set to a predetermined value of about $(E-V_1)$, where E is a total forward voltage drop between the bases and emitters of the NPN and PNP power transistors.

26 Claims, 15 Drawing Sheets

SEMICONDUCTOR DEVICE HAVING SEPP CONNECTED NPN AND PNP TRANSISTORS

BACKGROUND OF THE INVENTION

1. Field of the Invention

The present invention relates to a semiconductor device and more particularly to a semiconductor device having a first semiconductor device and a second semiconductor device capable of being SEPP connected, the first semiconductor device including an NPN power transistor formed on a first semiconductor substrate and the second semiconductor device including a PNP power transistor complementary to the NPN power transistor formed on a second semiconductor substrate.

2. Description of the Related Art

An output or final stage of a power amplifier uses a complementary pair of NPN and PNP power transistors SEPP (single ended push-pull) connected to output a large power. An SEPP circuit has a bias circuit for applying a bias voltage between the bases of the two power transistors. This bias voltage is set to generally the same as the total forward voltage drop between the bases and emitters of the two power transistors. Therefore, an idling current (e.g., about several tens mA for a B-class amplifier having a maximum output of several tens W) flows through the two power transistors to prevent crossover distortions of an output waveform.

The forward voltage drop $V_{BE}$ between the base and emitter of a power transistor has a negative temperature coefficient of about −2 to −2.5 mV/° C. If the bias voltage $V_{bias}$ is maintained constant, the operating point changes as the temperature rises by heat generated by the power transistor, so that the idling current increases which causes heat generation and temperature risk. This vicious cycle (thermorunaway) may break both the power transistors. In order to avoid this, bias circuits shown in FIGS. 13 and 14 have been used. The bias circuit 1 shown in FIG. 13 is of a diode type constituted of serially connected n diodes $D_1$ to $D_n$ and a variable resistor $VR_1$ for adjusting a bias voltage (idling current). The bias circuit 3 shown in FIG. 14 is of a transistor type constituted of a bias transistor 2, a fixed resistor $R_{11}$, a variable resistor $VR_2$, and a fixed resistor $R_{12}$. The diodes $D_1$ to $D_n$ and bias transistor 2 are thermally coupled to NPN and PNP power transistors 4 and 5 to effect temperature compensation of the idling current. Since the forward voltage drop $V_{F1}$ to $V_{Fn}$ has the same negative temperature coefficient of about −2 to −2.5 mV/° C., the bias voltage $V_{bias}$ lowers as the temperature rises, so that the idling current can be maintained constant. Furthermore, since the forward voltage drop $V_{BE}$ between the base and emitter of the bias transistor 2 has the same negative temperature coefficient of about −2 to −2.5 mV/° C., the bias voltage lowers as the temperature rises, so that the idling current can be maintained constant.

In FIGS. 13 and 14, reference numerals 6 and 7 represent emitter resistors. The final driver stage 10 is constituted of a resistor R5, a transistor Tr5, a resistor R6, and a transistor Tr6. The drive stage 10 is connected via oscillation suppressing resistors R7 and R8 to the bias circuit 1, 3.

NPN and PNP power transistors are available in markets as discrete semiconductor devices. If NPN and PNP power transistors are SEPP connected as the final stage of a power amplifier, NPN and PNP power transistors having desired electrical characteristics are selected and fixed to a heat sink. Diodes and transistors for bias circuits are also available in markets as discrete semiconductor devices having various types of electrical characteristics. Diodes and transistors having electrical characteristics suitable for bias circuits are selected and fixed to the same heat sink as that of the power transistors to thermally couple them to the power transistors.

FIG. 15 shows an example of a wiring layout of the driver and final stages of the power amplifier using the transistor type bias circuit 3 shown in FIG. 14. Reference numeral 8 represents a heat sink, reference numeral 9 represents a printed circuit board, and reference numerals 4 and 5 represent NPN and PNP power transistors fixed to the heat sink 8, the base terminals (B) and (B'), collector terminal (C) and (C'), and emitter terminals (E) and (E') of the NPN and PNP power transistors being connected to the printed board circuit 9. The NPN and PNP power transistors each are constituted of Darlington connected transistors. Reference numerals 6 and 7 represent emitter resistors. Reference numeral 2 represents a bias transistor fixed to the heat sink 8, the base terminal (B), collector terminal (C), and emitter terminal (E) of the bias transistor being connected to the printed circuit board 9. The bias transistor 2 constitutes a bias circuit in combination with a fixed resistor $R_{11}$, a variable resistor $VR_2$, and a fixed resistor $R_{12}$.

As seen from FIG. 15, since the bias transistor 2 and NPN and PNP power transistors 4 and 5 are discrete components, all of them are required to be fixed separately to the heat sink 8. Much works are therefore necessary resulting in high cost. Since the bias transistor 2 is physically remote from the base-emitter junctions of the two NPN and PNP power transistors 4 and 5, the temperature rise of the NPN and PNP power transistors 4 and 5 has a time lag until it is transmitted to the bias transistor 2. Furthermore, since the bias transistor 2 is difficult to raise its temperature to the temperatures of the NPN and PNP power transistors 4 and 5, reliable temperature compensation for the idling current is difficult and so the reliability of preventing thermorunaway is low.

Still further, since the bias transistor 2 is disposed between the NPN and PNP power transistors 4 and 5 and interconnections are made on the printed circuit board 9, the interconnections between the collector terminals (C) and (C') and emitter terminals (E) and (E') become long. Therefore, a large mount area is required, a large electromagnetic radiation is generated because of inductance of printed wires, and output distortion becomes large.

These disadvantages are also true for the diode type bias circuit.

Several semiconductor devices with ideal thermal coupling have been proposed in which an NPN or PNP power transistor and a temperature compensating and biasing circuit diode are integrally formed on the same semiconductor substrate (Japanese Patent Laid-open Publications Nos. 53-29082, 63-169764, 63-190381, and so on). Use of these semiconductor devices for an SEPP circuit may eliminate the above disadvantages.

In order to form a diode on the same semiconductor substrate as an NPN power transistor at as small cost as possible, a PN junction diode is used. However, if the device structure is made simple, parasitic transistors are inevitably formed. It is possible to use the base-emitter junction of a parasitic transistor as a diode. However, in this case, it is necessary to lower the current amplification factor $h_{fe}$ of the parasitic transistor as small as 1/10 or lower. The forward voltage drop of the diode at this amplification factor is about 1 V which is very different from the forward voltage drop $V_{BE} \approx 0.6$ V between the base-emitter of a power transistor (if the power transistor is constituted of two-stage Darlington connected transistors, $2V_{BE} \approx 1.2$ V, and for three-stage Darlington connected transistors, $3V_{BE} \approx 1.8$ V).

Similar to the above, if a PN junction diode is formed on the same semiconductor substrate as a PNP power transistor, the forward voltage drop of the diode becomes very different from the forward voltage drop $V_{BE} \approx 0.6$ V between the base-emitter of a power transistor (if the power transistor is constituted of two-stage Darlington connected transistors, $2V_{BE} \approx 1.2$ V, and for three-stage Darlington connected transistors, $3V_{BE} \approx 1.8$ V).

Therefore, even if a first semiconductor device integrating an NPN power transistor and a temperature compensating and biasing diode on the same semiconductor substrate is used in combination with a second semiconductor device integrating a PNP power transistor and a temperature compensating and biasing diode on the same semiconductor substrate, the bias voltages mismatch. Therefore, this combination cannot be applied and semiconductor makers do not manufacture and sell such semiconductor devices.

As shown in FIG. 3 of Japanese Patent Laid-open Publication No. 63-169764, if a power transistor and a diode are formed on different semiconductor substrates, the forward voltage drop of the diode can be set about 0.6 V same as the forward voltage drop between the base and emitter of the power transistor. However, thermal coupling becomes imperfect and the manufacture cost rises.

From this reason, with the conventional techniques, NPN and PNP power transistors and bias circuit transistors or diodes are prepared independently and mounted separately on a heat sink. Therefore, the problems described earlier cannot be solved, the problems including complicated works in manufacturing SEPP circuits, poor temperature compensation, large mount area, and large output distortion.

SUMMARY OF THE INVENTION

It is an object of the present invention to solve the above-described problems associated with the conventional techniques and provide a semiconductor device capable of maintaining good temperature compensation and reducing manufacture works of SEPP connecting NPN and PNP power transistors and temperature compensating and biasing circuits.

It is another object of the present invention to provide a semiconductor device which does not require a large mount area for SEPP connection and can suppress output distortion.

The semiconductor device recited in claim 1 comprises a first semiconductor device having an NPN power transistor formed on a first semiconductor substrate and a second semiconductor device having a PNP power transistor complementary to the NPN power transistor formed on a second semiconductor substrate, the first and second semiconductor devices capable of being SEPP connected, the first semiconductor device having one or a plurality of serially connected bias circuit diodes formed on the first semiconductor device, the anode side of the diode or diodes being connected to the base of the NPN power transistor and the cathode side thereof being connected to a first bias terminal, the second semiconductor device having one or a plurality of serially connected bias circuit diodes formed on the second semiconductor device, the cathode side of the diode or diodes being connected to the base of the PNP power transistor and the anode side thereof being connected to a second bias terminal, wherein the total forward voltage drop $V_1$ of the bias circuit diode or diodes of one of the first and second semiconductor devices is set to an arbitrary constant value smaller than E exclusive of about E/2, and the bias circuit diode or diodes of the other of the first and second semiconductor devices are Schottky barrier diodes and the total forward voltage drop $V_2$ of the bias diode or diodes is set to a predetermined value of about $(E-V_1)$, where E is a total forward voltage drop between the bases and emitters of the NPN and PNP power transistors of the first and second semiconductor devices.

The total forward voltage drop $V_1$ of the bias circuit diode or diodes of one of the first and second semiconductor devices is set to an arbitrary constant value smaller than E exclusive of about E/2, where E is a total forward voltage drop between the bases and emitters of the NPN and PNP power transistors of the first and second semiconductor devices. It is therefore possible to form an ordinary diode such as a PN junction diode on the same semiconductor substrate as the NPN or PNP power transistor. The manufacture is therefore easy and cost effective. The bias circuit diode of the other of the first and second semiconductor devices uses a Schottky barrier diode. Therefore, the forward voltage drop per one diode can be set finely in the range from 0.1 to 0.5 V, by using relatively simple structure. The total forward voltage drop $V_2$ of the diodes can be easily set to a predetermined value of about $(E-V_1)$. As a result, only by mounting the first and second semiconductor devices on a heat sink, the diodes of a bias circuit for generating a proper bias voltage can be automatically mounted and the assembly work of the SEPP circuit can be simplified. Since Schottky diodes are used only for one of the first and second semiconductor devices, a rise of component cost is small.

The diodes of the first and second semiconductor devices are formed on the same semiconductor substrate as the NPN or PNP power transistor. Accordingly, ideal thermal coupling can be realized and good temperature compensation can be performed.

If a combination of the complementary first and second semiconductor devices is selected, the bias circuit diodes are automatically selected so that design of the SEPP circuit is simple.

Each of the first and second semiconductor devices may be used as a conventional NPN or PNP power transistor.

In the semiconductor device recited in claim 2 depending from claim 1, a bias voltage adjusting resistor is serially connected to the bias circuit diode or diodes of the first or second semiconductor device.

The bias voltage adjusting resistor is serially connected to the bias circuit diode or diodes. Therefore, if the value of this bias voltage adjusting resistor is set to an optimum value of the bias circuit of the SEPP circuit constituted by the first and second semiconductor devices, the bias voltage adjustment can be dispensed with and the adjustment work of the bias circuit after the assembly of the SEPP circuit becomes unnecessary. In this connection, a conventional external bias circuit requires large works and long time which cause a large increase in manufacture cost. With the conventional method, after the assembly of an SEPP circuit, the temperature is raised to a predetermined value and the temperatures of the NPN and PNP power transistors and bias circuit elements are made equal to each other. Thereafter, the bias voltage adjusting resistor is adjusted to set the idling current to a predetermined rated value.

Since the number of interconnections for the bias circuit on the printed circuit board can be reduced, the mount area reduces. Therefore, the printed patterns of for the emitter and collector terminals to be formed on the printed circuit board for the SEPP connection can be shortened so that electromagnetic radiation is reduced and the generation of output distortion can be suppressed.

In the semiconductor device recited in claim 3 depending from claim 1 or 2, the first semiconductor device includes a base terminal, a collector terminal, and an emitter terminal respectively connected to the base, collector, and emitter sides of the NPN power transistor; and the second semiconductor device includes a base terminal, a collector terminal, and an emitter terminal respectively connected to the base, collector, and emitter sides of the PNP power transistor, and wherein the terminals are disposed so that when the first and second semiconductor devices are juxtaposed side by side, the emitter terminals are positioned at the most inner side and the collector terminals are positioned at the second most inner side.

The terminals are disposed so that when the first and second semiconductor devices are juxtaposed side by side, the emitter terminals are positioned at the most inner side and the collector terminals are positioned at the second most inner side. Therefore, the printed patterns of the printed circuit board for the emitter and collector terminals necessary for the SEPP connection can be made short so that electromagnetic radiation is reduced and output distortion can be suppressed.

In the semiconductor device recited in claim 4 depended from claim 3, an emitter resistor is connected between the emitter terminal and the emitter of the NPN power transistor of the first semiconductor device, and an emitter resistor is connected between the emitter terminal and the emitter of the PNP power transistor of the second semiconductor device.

Since the emitter resistor is provided to the NPN and PNP power transistors of both the first and second semiconductor devices, works and spaces for externally connecting the emitter resistors can be omitted.

In the semiconductor device recited in claim 5 depended from claim 3, an emitter resistor is connected at one end to the emitter of the NPN power transistor of the first semiconductor device, the other end thereof being connected to a second emitter terminal, and an emitter resistor is connected at one end to the emitter of the PNP power transistor of the second semiconductor device, the other end thereof being connected to a second emitter terminal, wherein when the first and second semiconductor devices are juxtaposed side by side, the second emitter terminals are positioned more inner than emitter terminals.

One end of the built-in emitter resistor is connected to the second emitter terminal different from the emitter terminal connected to the emitter side of the power transistor. Therefore, the emitter of the power transistor can be connected directly to an external circuit without being intervened by the built-in emitter resistor. In this case, the collector current of the power transistor can be monitored by measuring a voltage across the built-in emitter resistor, or another emitter resistor may be connected externally for changing the value of the built-in emitter resistor. The second emitter terminals are positioned at the most inner side when the first and second semiconductor devices are juxtaposed side by side. Therefore, in the standard case using the built-in emitter resistors, the second emitter terminals can be interconnected by a shortest distance on the printed circuit board so that the length of the printed pattern for the loudspeaker output can be made shortest.

In the semiconductor device recited in claim 6 depended from claim 1 or 2, the anode side of the bias circuit diode or diodes of the first semiconductor device is connected to a base terminal, a base resistor being connected between the anode side and the base of the NPN power transistor, and the cathode side of the bias circuit diode or diodes of the second semiconductor device is connected to a base terminal, and a base resistor being connected between the cathode side and the base of the PNP power transistor.

The amount of current flowing through the resistor connected between the driver stage and the bases of the NPN and PNP power transistors for the oscillation suppression can be reduced and the voltage loss across the oscillation suppressing resistor can be reduced. As a result, an output of the power amplifier constituted of the first and second semiconductor devices SEPP connected can be increased. If the oscillation suppressing base resistor is built in the first and second semiconductor devices, works and spaces required for externally connecting oscillation suppressing inflammable resistors to the printed circuit board can be omitted and the cost can be lowered.

In the semiconductor device recited in claim 10 depending from claim 1 or 2, the NPN power transistor of the first semiconductor device includes Darlington connected n-stage NPN transistors, the emitter of each of n-stage NPN transistors being connected via an emitter resistor to an emitter terminal, and the PNP power transistor of the second semiconductor device includes Darlington connected n-stage PNP transistors, the emitter of each of n-stage PNP transistors being connected via an emitter resistor to an emitter terminal.

If the polarity of an input signal to the first and second semiconductor devices SEPP connected changes, for example, from plus to minus, carriers accumulated in the bases of the transistors at the second and following stages among n-stage NPN transistors can be absorbed rapidly in the bases of the transistors at the second and following stages among n-stage PNP transistors, and the n-stage NPN transistors can be cut off quickly, without passing through the last stage emitter resistor. As a result, crossover distortion is hard to be generated. Further, since a large through current is prevented from flowing through the last stage NPN transistor to the last stage PNP transistor, breakage of these last stage transistors can be avoided.

In the semiconductor device recited in claim 12 depending from claim 1 or 2, the NPN power transistor of the first semiconductor device includes Darlington connected n-stage NPN transistors, the emitter of the last stage NPN transistor being connected to a first emitter terminal and the base of each of the second and following stage NPN transistors being connected via an emitter resistor to a second emitter terminal, and the PNP power transistor of the second semiconductor device includes Darlington connected n-stage PNP transistors, the emitter of the last stage PNP transistor being connected to a first emitter terminal and the base of each of the second and following stage PNP transistors being connected via an emitter resistor to a second emitter terminal.

Similar to the semiconductor device recited in claim 10, if the polarity of an input signal to the first and second semiconductor devices SEPP connected changes, for example, from plus to minus, carriers accumulated in the bases of the transistors at the second and following stages among n-stage NPN transistors can be absorbed rapidly in the bases of the transistors at the second and following stages among n-stage PNP transistors, without passing through the last stage emitter resistor. As a result, crossover distortion is hard to be generated. Further, since a large through current is prevented from flowing through the last stage NPN transistor to the last stage PNP transistor, breakage of these last stage transistors can be avoided.

The semiconductor device recited in claim 14 comprises a first semiconductor device having an NPN power transistor formed on a first semiconductor substrate, a second semiconductor device having a PNP power transistor complementary to the NPN power transistor formed on a second semiconductor substrate, the first and second semiconductor devices capable of being SEPP connected, and a bias circuit transistor for SEPP connection formed on the same semiconductor substrate as the NPN or PNP power transistor of the first or second semiconductor device, the collector and emitter of the bias circuit transistor being connected across the base of the NPN or PNP power transistor and a bias terminal, and the connection point to the base of the NPN or PNP power transistor being connected to a base terminal.

The bias circuit transistor for SEPP connection of the first or second semiconductor devices is formed on the same semiconductor substrate as the NPN or PNP power transistor. As a result, only by mounting the first and second semiconductor devices on a heat sink, the transistor of a bias circuit for generating a proper bias voltage can be automatically mounted and the assembly work of the SEPP circuit can be simplified.

Since the bias transistor is formed on the same semiconductor substrate as the NPN or PNP power transistor of the first or second semiconductor device, ideal thermal coupling can be realized and good temperature compensation can be performed.

If a combination of the complementary first and second semiconductor devices is selected, the bias circuit transistor is automatically selected so that design of the SEPP circuit is simple.

Since transistors can be integrated on a semiconductor substrate very easily, an increase of component cost rarely occurs.

Each of the first and second semiconductor devices may be used as a conventional NPN or PNP power transistor.

In the semiconductor device recited in claim 15 depended from claim 14, the first or second semiconductor device formed with the bias circuit transistor is provided with a voltage divider circuit made of resistors, opposite ends of the voltage divider circuit are connected in parallel across the collector and emitter of the bias circuit transistor, and a voltage division point is connected to the base of the bias circuit transistor.

The first or second semiconductor device formed with the bias circuit transistor is provided with the voltage divider circuit made of resistors, one end of the voltage divider circuit being connected to the bias terminal, the other end thereof being connected to the base of the NPN or PNP power transistor, and the voltage division point being connected to the base of the bias circuit transistor. Therefore, if the resistance value of the voltage divider circuit is set to an optimum value of the bias circuit of the SEPP circuit constituted by the first and second semiconductor devices, the bias voltage adjustment can be dispensed with.

Since the number of interconnections for the bias circuit on the printed circuit board can be reduced, the mount area reduces. Therefore, the printed patterns of for the emitter and collector terminals to be formed on the printed circuit board for the SEPP connection can be shortened so that electromagnetic radiation is reduced and the generation of output distortion can be suppressed.

In the semiconductor device recited in claim 16 depended from claim 14 or 15, the first semiconductor device includes a collector terminal and an emitter terminal respectively connected to the collector side and the emitter side of the NPN power transistor, and the second semiconductor device includes a collector terminal and an emitter terminal respectively connected to the collector side and the emitter side of the PNP power transistor, wherein when the first and second semiconductor devices are juxtaposed side by side, the terminals are disposed so that the emitter terminals are positioned at the most inner side and the collector terminals are positioned at the next most inner side.

The terminals are disposed so that when the first and second semiconductor devices are juxtaposed side by side, the emitter terminals are positioned at the most inner side and the collector terminals are positioned at the second most inner side. Therefore, the printed patterns of the printed circuit board for the emitter and collector terminals necessary for the SEPP connection can be made short so that electromagnetic radiation is reduced and output distortion can be suppressed.

In the semiconductor device recited in claim 17 depended from claim 16, an emitter resistor is connected between the emitter of the NPN power transistor and the emitter terminal of the first semiconductor device, and an emitter resistor is connected between the emitter of the PNP power transistor and the emitter terminal of the second semiconductor device.

Since the emitter resistor is provided to the NPN and PNP power transistors of both the first and second semiconductor devices, works and spaces for externally connecting the emitter resistors can be omitted.

In the semiconductor device recited in claim 18 depended from claim 16, an emitter resistor is connected at one end to the emitter of the NPN power transistor of the first semiconductor device, the other end of the emitter resistor being connected to a second emitter terminal formed on the first semiconductor device, an emitter resistor is connected at one end to the emitter of the PNP power transistor of the second semiconductor device, the other end of the emitter resistor being connected to a second emitter terminal formed on the second semiconductor device, wherein when the first and second semiconductor devices are juxtaposed side by side, the terminals are disposed so that the second emitter terminals are positioned more inner than the emitter terminals.

The amount of current flowing through the resistor connected between the driver stage and the bases of the NPN and PNP power transistors for the oscillation suppression can be reduced and the voltage loss across the oscillation suppressing resistor can be reduced. As a result, an output of the power amplifier constituted of the first and second semiconductor devices SEPP connected can be increased. If the oscillation suppressing base resistor is built in the first and second semiconductor devices, works and spaces required for externally connecting oscillation suppressing inflammable resistors to the printed circuit board can be omitted and the cost can be lowered.

In the semiconductor device recited in claim 19 depended from claim 14 or 15, the first or second semiconductor device with a built-in bias circuit resistor has a base resistor connected between the emitter or collector of the built-in bias circuit connected to the base terminal and the base of the NPN or PNP power transistor, and the first or second semiconductor device without a built-in bias circuit resistor has a base resistor connected between the base of the NPN or PNP power transistor and the base terminal.

The amount of current flowing through the resistor connected between the driver stage and the bases of the NPN and PNP power transistors for the oscillation suppression can be reduced and the voltage loss across the oscillation suppressing resistor can be reduced. As a result, an output of the power amplifier constituted of the first and second semiconductor devices SEPP connected can be increased. If the oscillation suppressing base resistor is built in the first and second semiconductor devices, works and spaces required for externally connecting oscillation suppressing inflammable resistors to the printed circuit board can be omitted and the cost can be lowered.

In the semiconductor device recited in claim 23 depended from claim 14 or 15, the NPN power transistor of the first semiconductor device includes n-stage Darlington connected NPN transistors whose emitters are connected via respective emitter resistors to an emitter terminal and the PNP power transistor of the second semiconductor device includes n-stage Darlington connected NPN transistors whose emitters are connected via respective emitter resistors to an emitter terminal.

If the polarity of an input signal to the first and second semiconductor devices SEPP connected changes, for example, from plus to minus, carriers accumulated in the bases of the transistors at the second and following stages among n-stage NPN transistors can be absorbed rapidly in the bases of the transistors at the second and following stages among n-stage PNP transistors, and the n-stage NPN transistors can be cut off quickly, without passing through the last stage emitter resistor having a large voltage drop by an output current. As a result, crossover distortion is hard to be generated. Further, since a large through current is prevented from flowing through the last stage NPN transistor to the last stage PNP transistor, breakage of these last stage transistors can be avoided.

In the semiconductor device recited in claim 25 depended from claim 14 or 15, the NPN power transistor of the first semiconductor device includes n-stage Darlington connected NPN transistors, the emitter of the last stage NPN transistor is connected to a first emitter terminal, and the bases of the other NPN transistors at the second and following stages are connected via respective emitter resistors to a second emitter terminal, and the PNP power transistor of the second semiconductor device includes n-stage Darlington connected PNP transistors, the emitter of the last stage PNP transistor is connected to a first emitter terminal, and the bases of the other PNP transistors at the second and following stages are connected via respective emitter resistors to a second emitter terminal.

Similar to the semiconductor device recited in claim 23, if the polarity of an input signal to the power amplifier changes, for example, from plus to minus, carriers accumulated in the bases of the transistors at the second and following stages among n-stage NPN transistors can be absorbed rapidly in the bases of the transistors at the second and following stages among n-stage PNP transistors, and the n-stage NPN transistors can be cut off quickly, without passing through the last stage emitter resistor having a large voltage drop by the output current. As a result, crossover distortion is hard to be generated. Further, since a large through current is prevented from flowing through the last stage NPN transistor to the last stage PNP transistor, breakage of these last stage transistors can be avoided. Since another emitter resistors may be externally connected to the last stage NPN and PNP transistors, a desired resistance value can be set.

DETAILED DESCRIPTION OF THE PREFERRED EMBODIMENTS

Figure 1:
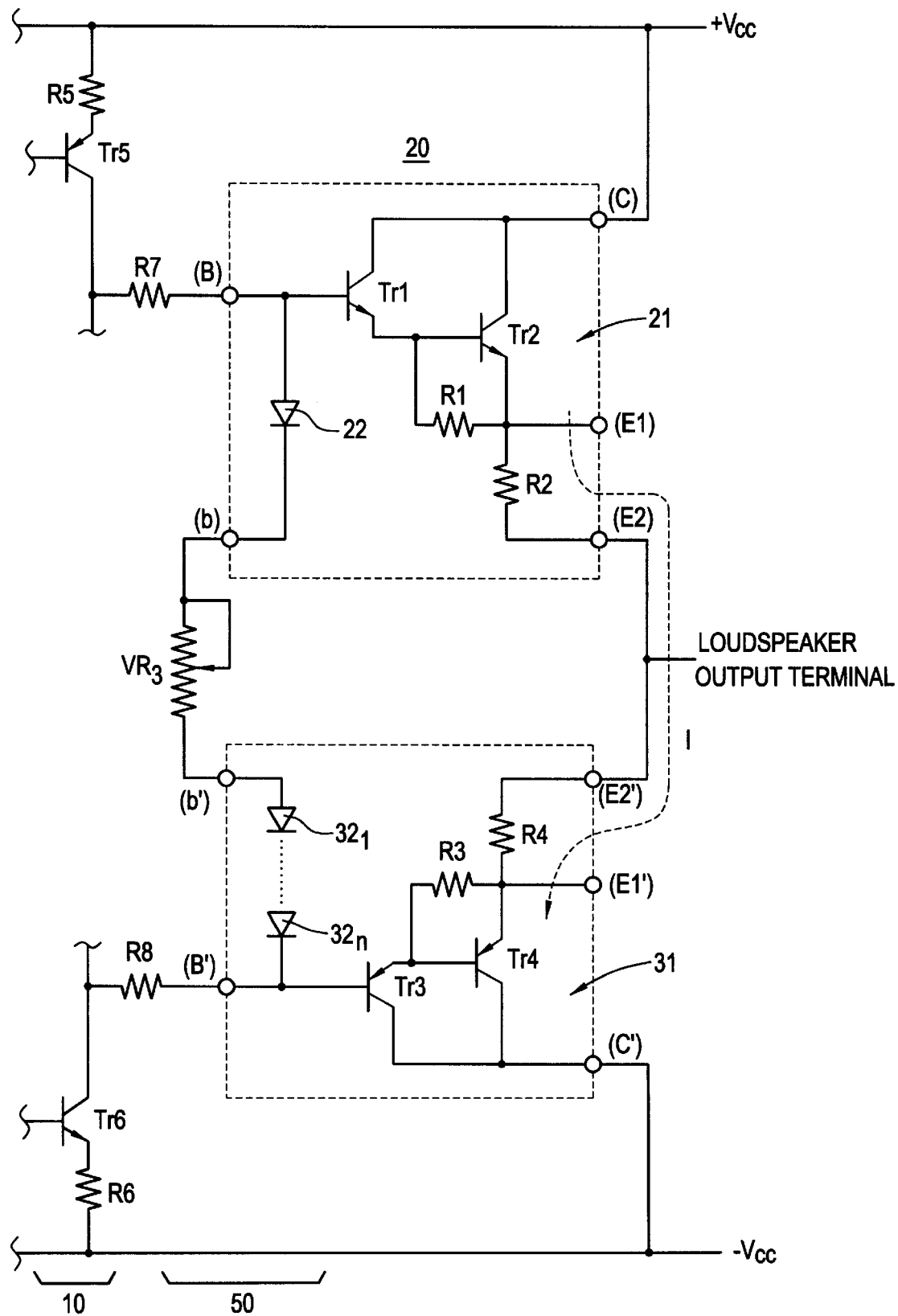
FIG. 1 is a circuit diagram showing the structure of a driver stage and an output stage of a power amplifier according to a first embodiment of the invention.
Figure 2:
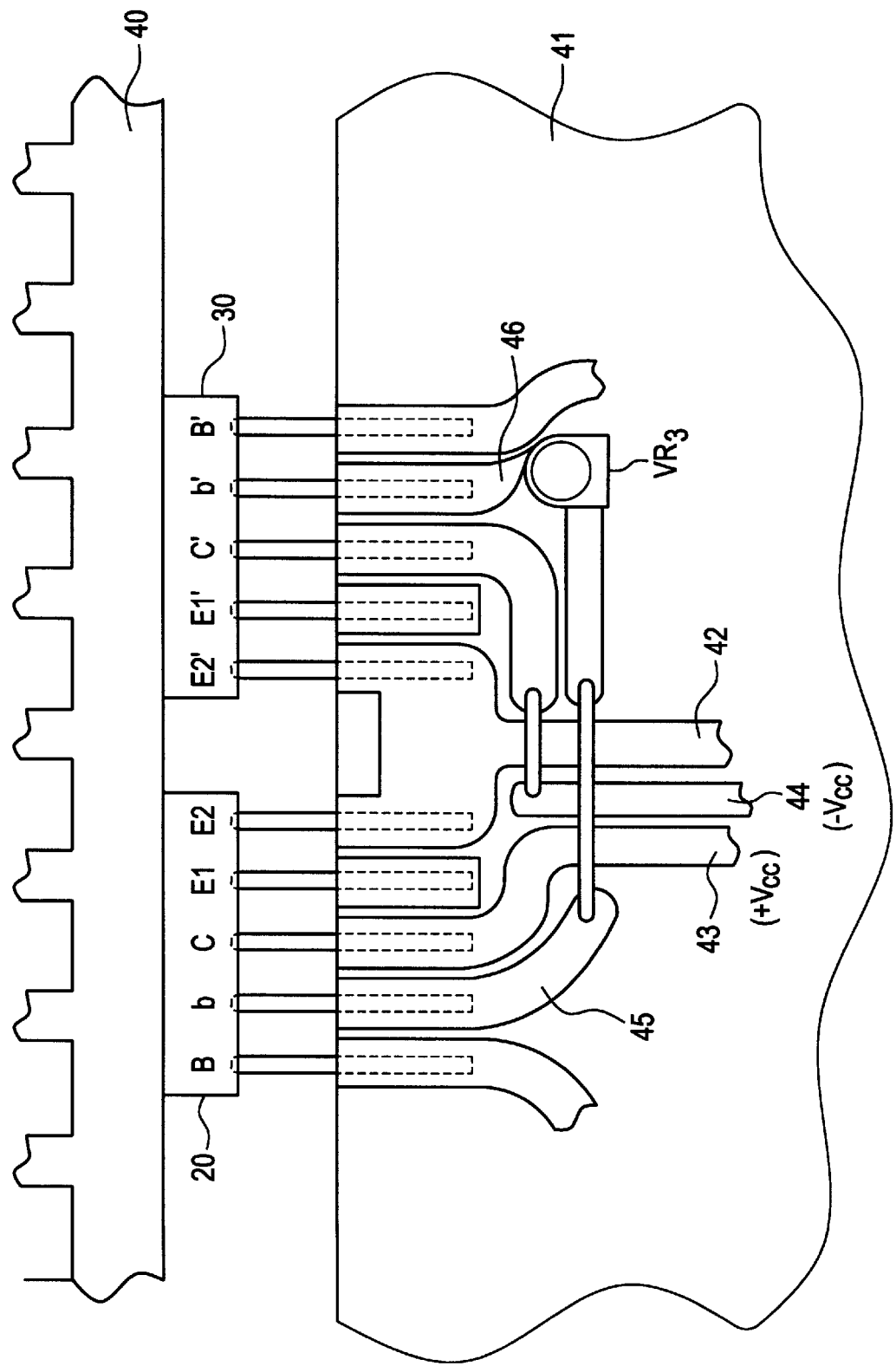
FIG. 2 is a diagram showing interconnections of the output stage of the power amplifier shown in FIG. 1.

FIG. 1 is a circuit diagram showing the structure of a driver stage and an output stage of a power amplifier according to the first embodiment of the invention, and FIG. 2 is a diagram showing interconnections of the output stage of the power amplifier.

Reference numeral 20 represents a first semiconductor device having an NPN power transistor 21 and an ordinary PN junction diode 22 integrally formed near to each other on the same semiconductor substrate by well known semiconductor manufacture processes. The NPN power transistor 21 is constituted of Darlington connected NPN transistors Tr1 and Tr2 whose emitters are connected to one ends of stabilizing emitter resistors R1 and R2. The other end of the emitter resistor R1 is connected to the emitter of the transistor Tr2, and the other end of the emitter resistor R2 is connected to a second emitter terminal (E2) for external connection. R1 is about 100 to 200Ω, for example 150Ω, and R2 is about 0.22 to 0.47Ω, for example 0.47Ω.

The forward voltage drop $V_{BE}$ of the base-emitter junction of the transistors Tr1 and Tr2 is both about 0.6 V. The temperature coefficient of $V_{BE}$ is a negative value of $\alpha_1$ mV/° C. ($\alpha_1$ is about −2).

The diode 22 constitutes a bias circuit of the SEPP circuit in combination with diodes of a second semiconductor device to be described later and a variable resistor. In order to make the diode 22 inexpensive, it is formed as a PN junction diode formed on the same semiconductor substrate, by inserting a P shielding region. The amplification factor $h_{fe}$ of the parasitic transistor is suppressed to ⅒ or smaller. Therefore, the forward voltage drop $V_F$ of the PN junction of the diode 22 is about 1 V. The temperature coefficient of $V_F$ is a negative value of $\alpha_2$ mV/° C. For the PN junction diode, $\alpha_2 \approx \alpha_1$.

The first semiconductor device 20 has five external connection terminals, including a base terminal (B), a bias terminal (b), a collector terminal (C), a first emitter terminal (E1), and a second emitter terminal (E2). Of the NPN power transistor 21, the base (base of transistor Tr1), collector (collectors of transistors Tr1 and Tr2), and emitter (emitter of transistor Tr2) are respectively connected to the base terminal (B), collector terminal (C), and first emitter terminal (E1). The cathode of the diode 22 is connected to the base terminal (b). The anode of the diode 22 is internally connected to the base (base of transistor Tr1) of the NPN power transistor.

The second semiconductor device 30 has the structure symmetrical to the first semiconductor device 20. The second semiconductor device 30 has a PNP power transistor 31 and n Schottky barrier diodes $32_1$ to $32_n$ integrally formed near to each other on the same semiconductor substrate by well known semiconductor manufacture processes. The PNP power transistor 31 is constituted of Darlington connected PNP transistors Tr3 and Tr4 and has the same electrical characteristics as the NPN power transistor 21 of the first semiconductor device, to thereby form a complementary pair therewith. The emitters of the transistors Tr3 and Tr4 are connected to one ends of stabilizing emitter resistors R3 and R4. The other end of the emitter resistor R3 is connected to the emitter of the transistor Tr4, and the other end of the emitter resistor R4 is connected to a second emitter terminal (E2') for external connection. R3 has the same value as R1, for example 150Ω, and R4 has the same value as R2, for example 0.47Ω.

The forward voltage drop $V_{BE}$ of the base-emitter junction of the transistors Tr3 and Tr4 is both about 0.6 V. The temperature coefficient of $V_{BE}$ is a negative value of $\alpha_3$ mV/° C. ($\alpha_3 \approx \alpha_1$).

The diodes $32_1$ to $32_n$ are serially connected in the second semiconductor device 30, and the cathode side of the diodes is internally connected to the base (base of transistor Tr3) of the PNP power transistor 31. Since these diodes $32_1$ to $32_n$ are Schottky barrier (metal-semiconductor junction) diodes, the forward voltage drop per one diode can be set finely in the range from 0.1 to 0.5 V, by using relatively simple structure. Therefore, the total forward voltage drop $V_2$ of the diodes can be set freely. Although the temperature coefficients $\alpha_{41}$ to $\alpha_{4n}$ mV/° C. of the diodes $32_1$ to $32_n$ take a negative value, these temperature coefficients have some freedom of design near a value of -2. It is simple to set $\alpha_{4i} \approx \alpha_1$ (I≈1 to n).

The following description is directed to the number n of diodes $32_1$ to $32_n$, the forward voltage drops $V_{G1}$ to $V_{Gn}$ of the diodes $32_1$ to $32_n$, the total forward voltage drop of the diodes $32_1$ to $32_n$, and the temperature coefficients $\alpha_{41}$ to $\alpha_{4n}$.

If E is the total forward voltage drop between the bases and emitters of the NPN and PNP power transistors 21 and 31, then $E \approx 4V_{BE} \approx 2.4$ V where $V_{BE}$ is the forward voltage drop between the base and emitter of each transistor Tr1 to Tr4 and is about 0.6 V.

It is necessary to set the bias voltage $V_{bias}$ of the bias circuit to generally the same value as E. If $V_1$ is the forward voltage drop of the diode of the bias circuit of the first semiconductor device 20, $V_1 \approx 1$ V. Therefore, the diodes $32_1$ to $32_n$ are formed to have the total forward voltage drop $V_2$ generally the same value as (2.4 V−1 V)=1.4 V. In practice, $V_2$ is set to a predetermined value slightly smaller than (E−$V_1$) and the bias voltage capable of flowing a desired idling current is adjusted by a variable resistor $VR_3$ to be described later.

The temperature coefficient A of the total forward voltage drop E between the bases and emitters of the NPN and PNP power transistors 21 and 31 is 2 ($\alpha_1+\alpha_3$), and the temperature coefficient of the forward voltage drop $V_1$ of the bias circuit of the first semiconductor device 20 is $\alpha_2$. Therefore, if B is the temperature coefficient of the total forward voltage drop $V_2$ of the diodes $32_1$ to $32_n$ of the bias circuit of the second semiconductor device 30, then B≈(A−$\alpha_2$), i.e., $$\alpha_{41}+\alpha_{42}+\ldots+\alpha_{4n} \approx 2(\alpha_1+\alpha_3)-\alpha_2 \tag{1}$$

The forward voltage drops $V_{G1}$ to $V_{Gn}$ of the diodes $32_1$ to $32_n$ may be the same for some of them or may be different for all of them. The temperature coefficients $\alpha_{41}$ to $\alpha_{4n}$ of $V_{G1}$ to $V_{Gn}$ may be the same for some of them or may be different for all of them.

For example, if the forward voltage drops $V_{G1}$ to $V_{Gn}$ of the diodes $32_1$ to $32_n$ are all the same and the temperature coefficients $\alpha_{41}$ to $\alpha_{4n}$ of $V_{G1}$ to $V_{Gn}$ are all the same, then in the range of $0.1 \text{ V} \leq V_{Gi} \leq 0.5$ V $V_{Gi} \approx 1.4/n$ $\alpha_{4i} \approx (2\alpha_1+2\alpha_3-\alpha_2)/n$ where i=1−n If n=3 and $\alpha_1=\alpha_3=\alpha_2$, then $V_{Gi} \approx 1.4/3$V and $\alpha_{4i} \approx \alpha_1$.

The second semiconductor device 30 has five external connection terminals, including a base terminal (B'), a bias terminal (b'), a collector terminal (C'), a first emitter terminal (E1'), and a second emitter terminal (E2'). Of the PNP power transistor 31, the base (base of transistor Tr3), collector (collectors of transistors Tr3 and Tr4), and emitter (emitter of transistor Tr4) are respectively connected to the base terminal (B'), collector terminal (C'), and first emitter terminal (E1'). The cathode side of the serially connected diodes $32_1$ to $32_n$ is connected to the base terminal (b').

As shown in FIG. 2, the connection terminals of the first and second semiconductor devices 20 and 30 are symmetrical to each other when they are juxtaposed side by side. The second emitter terminals (E2) and (E2'), first emitter terminals (E1) and (E1'), collector terminals (C) and (C'), bias terminals (b) and (b'), and base terminals (B) and (B') are disposed in this order from the inner side to the outer side.

As shown in FIG. 2, for the SEPP connection of the power amplifier using the first and second semiconductor devices 20 and 30, these devices 20 and 30 are mounted on the same principal plane of a heat sink 40, being juxtaposed side by side. The connection terminals (B), (b), (C), (E1), (E2), (B'), (b'), (C'), (E1'), and (E2') are connected to corresponding terminals of a printed circuit board 41. If the emitter resistors to be used are R2 connected between the first and second emitter terminals (E1) and (E2) and R4 connected between the first and second emitter terminals (E1') and (E2'), the second emitter terminals (E2) and (E2') are connected together by a printed pattern 42 for a loudspeaker terminal (SP). Since the bias circuit diode is not necessary to be connected between the first and second semiconductor devices 20 and 30 mounted on the heat sink 40 and since the first and second semiconductor devices 20 and 30 are disposed symmetrically, the second emitter terminals (E2) and (E2') are positioned nearest. Therefore, they can be interconnected by a shortest distance and the printed pattern 42 is not necessary to be made long.

Printed patterns 43 and 44 for +$V_{cc}$ and –$V_{cc}$ adjacent to the printed pattern 42 connect +$V_{cc}$ to the collector terminal (C) of the first semiconductor device 20 and –$V_{cc}$ to the collector terminal (C') of the second semiconductor device 30. Since the collector terminals (C) and (C') are also positioned relatively adjacent to each other, the printed pattern 44 is not necessary to be made long.

Figure 15:
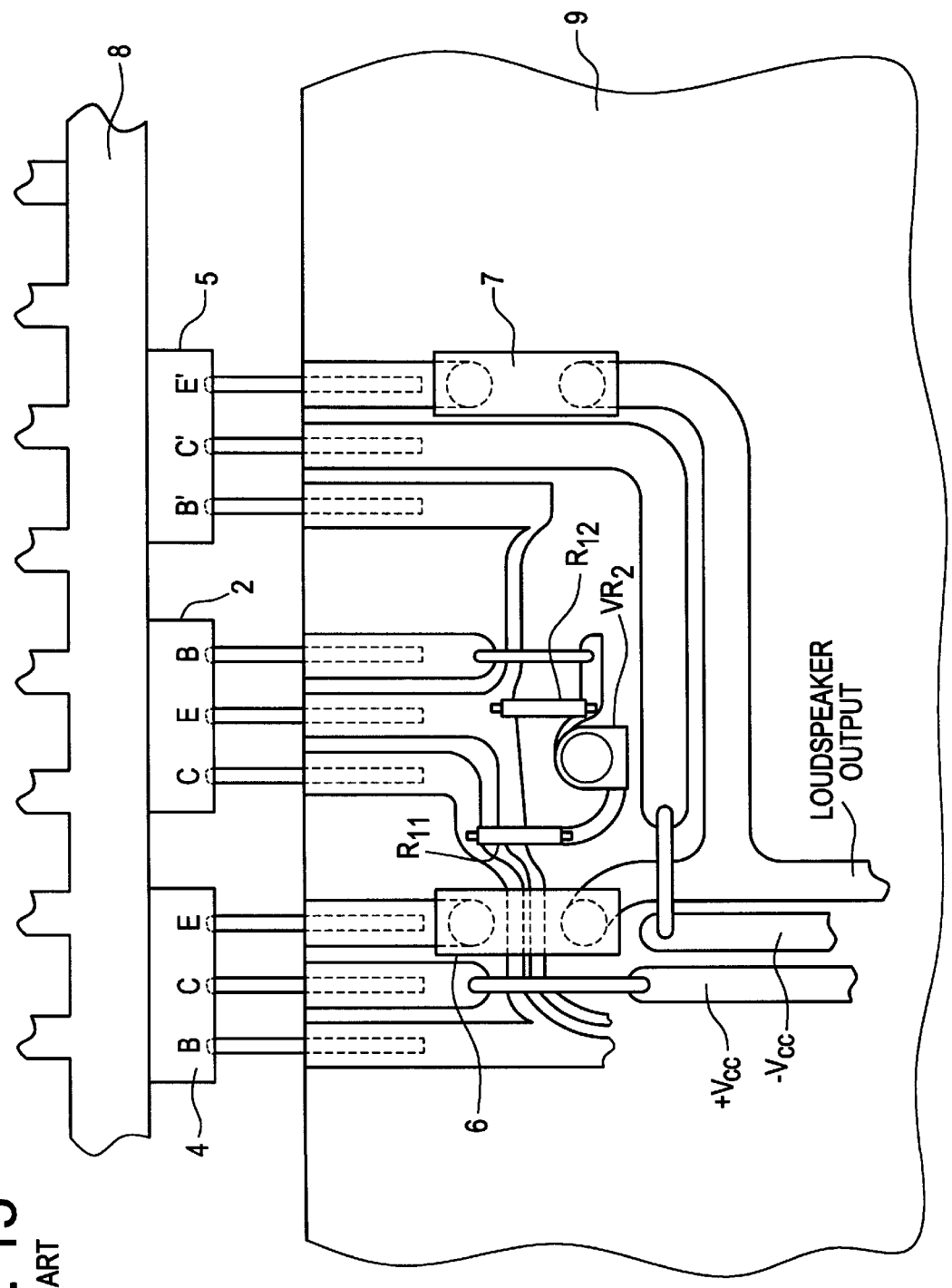
FIG. 15 is a diagram showing a layout of interconnections of the circuit shown in FIG. 14.

As compared to the conventional semiconductor device shown in FIG. 15, the mount area of the printed circuit board is considerably reduced by a half or more. It is therefore possible to make the amplifier compact, and electromagnetic radiation is also reduced so that output distortion can be suppressed greatly.

Furthermore, works and spaces for externally connecting the emitter resistors R2 and R4 can be omitted.

A circuit for monitoring a collector current flowing through the NPN power transistor 20 or PNP power transistor 30 may be connected to the first emitter terminal (E1) or (E1'), the circuit monitoring the collector current by measuring a voltage relative to the printed pattern 42. If the built-in emitter resistors R2 and R4 of the first and second semiconductor device 20 and 30 are to be changed to new values, resistors are connected between the first emitter terminal (E1) and the second emitter terminal (E2) and between the second emitter terminal (E1') and the second emitter terminal (E2').

As shown in FIG. 1, a final stage transistor Tr5 of the drive stage 10 and a resistor R5 are connected via an oscillation suppressing resistor R7 between the base terminal (B) of the first semiconductor device 20 and +$V_{cc}$, whereas a final stage transistor Tr6 of the drive stage 10 and a resistor R6 are connected via an oscillation suppressing resistor R8 between the base terminal (B') of the second semiconductor device 30 and –$V_{cc}$. The values of the resistors R7 and R8 are about several Ω to several hundreds Ω, for example 47Ω. In combination with the coupling capacitance $C_{CB}$ between the collectors and bases of the transistors Tr1 and Tr3, the resistors R7 and R8 lower the gain in the high frequency band to suppress oscillation.

A variable resistor $VR_3$ for bias voltage adjustment (idling current adjustment) is connected via printed patterns 45 and 46 between the bias terminal (b) of the first semiconductor device 20 and the bias terminal (b') of the second semiconductor device 30. A bias circuit 50 is constituted of the diode of the first semiconductor device 20 and variable resistor $VR_3$, and diodes $32_1$ to $32_n$.

The variable resistor $VR_3$ absorbs a variation of the characteristics of the first and second semiconductor devices 20 and 30 by setting the idling current to a predetermined value. In this embodiment, the diode 22 is formed on the same semiconductor substrate as the NPN power transistor 21 and the temperatures of the diode 22 and NPN power transistor 21 are always the same, and the diodes $32_1$ to $32_n$ are also formed on the same semiconductor substrate as the PNP power transistor 31 and the temperatures of the diodes and PNP power transistor are always the same. As a result, in adjusting the idling current by raising the temperature to a predetermined value, this adjustment work can be executed without waiting until the temperatures of the NPN power transistor 21 and diode 22 or the PNP power transistor 31 and diodes $32_1$ to $32_n$ become the same. Alternatively, the adjustment work can be executed without raising the temperature to the predetermined value. Accordingly, the adjustment time can be shortened greatly.

The total forward voltage drop of the diodes 22 and $32_1$ to $32_n$ is generally the same as the total forward voltage drop of the NPN and PNP power transistors 21 and 31 and the combined temperature coefficients are generally the same. Therefore, the idling current after adjustment becomes generally constant irrespective of the temperature change.

According to this embodiment, as the first and second semiconductor devices 20 and 30 having the matched electrical characteristics are SEPP connected, mounting the bias circuit diodes is automatically completed, reducing the amount of assembly work. The forward voltage drop of the diode of the first semiconductor device 20 may take an arbitrary value excepting about E/2. Therefore, an ordinary PN junction diode can be used. Since the Schottky barrier diodes are formed only in the second semiconductor device 30, the component cost can be reduced correspondingly.

In the first semiconductor device 20, the diode 22 formed on the same semiconductor substrate as the NPN power transistor catches a temperature rise of the NPN power transistor at the nearest distance, and changes its temperature characteristics cancelling out the temperature rise. In the second semiconductor device 30, the diodes $32_1$ to $32_n$ formed on the same semiconductor substrate as the PNP power transistor catch a temperature rise of the PNP power transistor at the nearest distance, and change their temperature characteristics cancelling out the temperature rise. Accordingly, ideal thermal coupling can be realized and good temperature compensation can be performed.

If a combination of the complementary first and second semiconductor devices 20 and 30 is selected, the bias circuit diodes are automatically selected so that design of the SEPP circuit is simple. Each of the first and second semiconductor devices 20 and 30 may be used as a conventional NPN or PNP power transistor.

The connection terminals are disposed so that when the first and second semiconductor devices 20 and 30 are juxtaposed side by side, the first emitter terminals (E1) and (E1') and second emitter terminals (E2) and (E2') are positioned at the most inner side, and the collector terminals (C) and (C') are positioned at the second most inner side. Therefore, the printed patterns of the printed circuit board for the emitter and collector terminals necessary for the SEPP connection can be made short so that electromagnetic radiation is reduced and output distortion can be suppressed.

Since the emitter resistors R2 and R4 of the NPN and PNP power transistors are built in the first and second semiconductor devices 20 and 30, works and spaces for mounting the emitter resistors on the printed circuit board can be omitted.

One ends of the built-in emitter resistors R2 and R4 are connected to the second emitter terminals (E2) and (E2') different from the first emitter terminals (E1) and (E1'). Therefore, the emitter of the power transistor can be connected directly to an external circuit without being intervened by the built-in emitter resistor. In this case, the collector current of the power transistor can be monitored by measuring a voltage across the built-in emitter resistor, or another emitter resistor may be connected externally for changing the value of the built-in emitter resistor. The second emitter terminals (E2) and (E2') are positioned at the most inner side when the first and second semiconductor devices 20 and 30 are juxtaposed side by side. Therefore, in the standard case using the built-in emitter resistors, the second emitter terminals (E2) and (E2') can be interconnected by a shortest distance on the printed circuit board 41 so that the length of the printed pattern for the loudspeaker output can be made shortest.

In the above embodiment, the variable resistor $VR_3$ is connected externally. Instead, if a variation of the electrical characteristics of the first and second semiconductor devices is small, the variable resistor $VR_3$ may be replaced by a fixed resistor suitable for setting an optimum bias voltage. This fixed resistor may be formed in the first or second semiconductor device and serially connected to the diodes. Furthermore, if the characteristics of the diodes of the first and second semiconductor devices are set to optimum values of the bias circuit, the fixed resistor itself can be omitted. In this manner, the bias voltage adjustment can be dispensed with and the adjustment work of the bias circuit after the assembly of the SEPP circuit becomes unnecessary. In this connection, a conventional external bias circuit requires large works and long time which cause a large increase in manufacture cost. With the conventional method, after the assembly of an SEPP circuit, the temperature is raised to a predetermined value and the temperatures of the NPN and PNP power transistors and bias circuit elements are made equal to each other. Thereafter, the bias voltage adjusting resistor is adjusted to set the idling current to a predetermined rated value.

Since the number of interconnections for the bias circuit on the printed circuit board can be reduced, the mount area reduces. Therefore, the printed patterns of for the emitter and collector terminals to be formed on the printed circuit board for the SEPP connection can be shortened so that electromagnetic radiation is reduced and the generation of output distortion can be suppressed.

The diode of the first semiconductor device may be a plurality of serially connected diodes, and the diodes of the second semiconductor device may use a single diode. Further, an ordinary diode may be formed in the second semiconductor device, and Schottky barrier diodes may be formed in the first semiconductor device.

The diodes of the first and second semiconductor devices have both the negative temperature coefficient of the forward voltage drop. Therefore, the conditions given by the equation are not necessary to be strictly satisfied, but if the relationship approximate to the equation (1) is satisfied, the temperature compensation near ideal state is possible.

Figure 3:
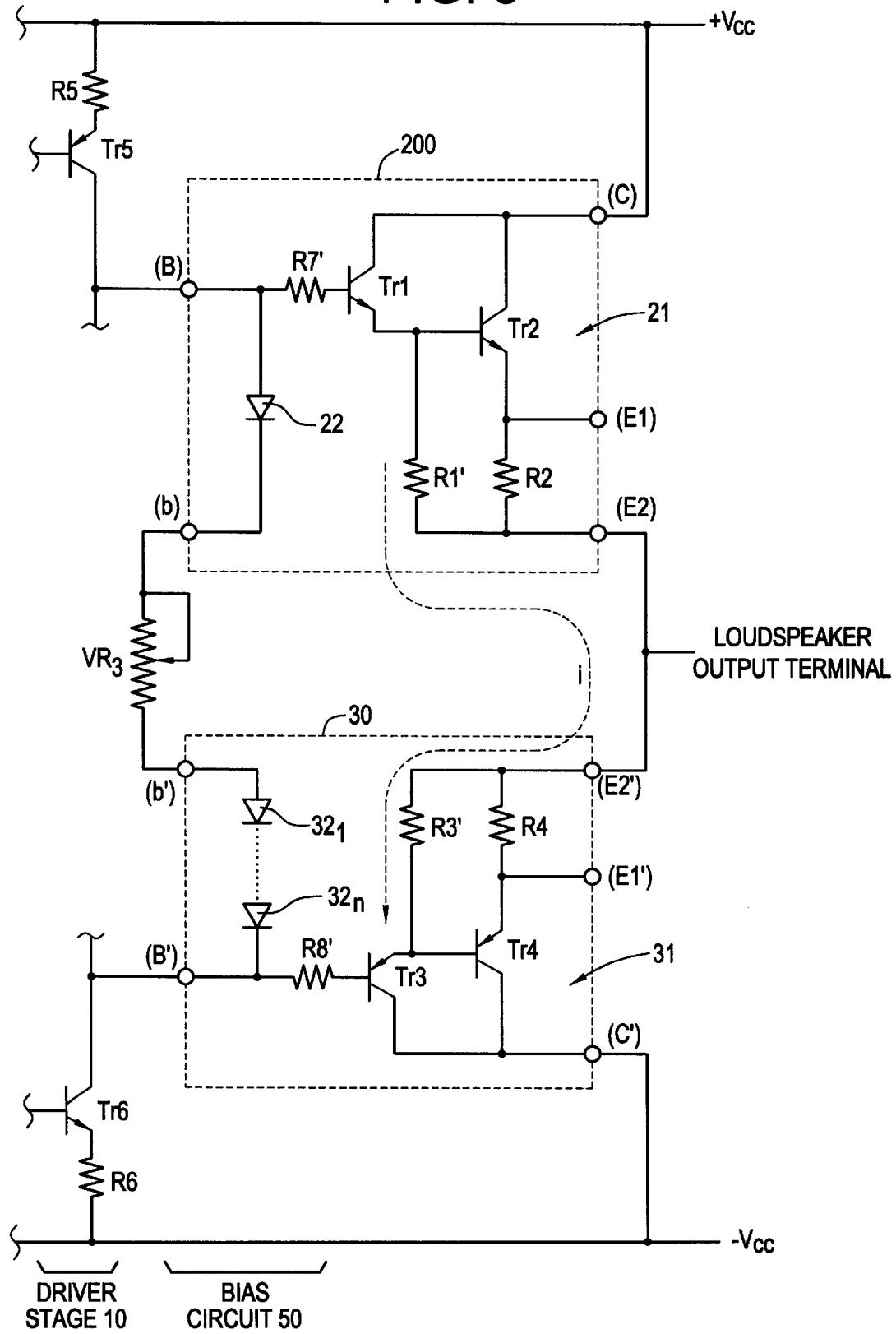
FIG. 3 is a circuit diagram showing the structure of a driver stage and an output stage of a power amplifier according to a modification of the first embodiment shown in FIG. 1.

FIG. 3 is a circuit diagram of a driver stage and an output stage of a power amplifier according to a modification of the first embodiment shown in FIG. 1.

In the embodiment shown in FIG. 1, the resistors R7 and R8 are connected between the final stage transistors Tr5 and Tr6 of the driver stage 10 and the bias circuit 50. In this modification shown in FIG. 3, an oscillation suppressing base resistor R7' is formed between the anode of the diode 22 and the base of the transistor Tr1 on the same semiconductor substrate as that of the NPN power transistor 21 and diode 22 of a first semiconductor device 200, and another oscillation suppressing base resistor R8' is formed between the cathode side of the diodes $32_1$ to $32_n$ and the base of the transistor Tr3 on the same semiconductor substrate as that of the PNP power transistor 31 and diodes $32_1$ to $32_n$ of a second semiconductor device 300. The values of the base resistors R7' and R8' are about several Ω to several hundreds Ω, for example, 47Ω.

In combination with the coupling capacitance $C_{CB}$ between the collectors and bases of the transistors Tr1 and Tr3, the base resistors R7' and R8' lower the gain in the high frequency band to suppress oscillation.

In the embodiment shown in FIG. 1, the emitter resistor R1 of the transistor Tr1 of the NPN power transistor 21 is connected between the emitters of the transistors Tr1 and Tr2, and the emitter resistor R3 of the transistor Tr3 of the PNP power transistor 31 is connected between the emitters of the transistors Tr3 and Tr4. In the modification shown in FIG. 3, the emitter resistor R1' of the transistor Tr1 is connected between the emitter of the transistor Tr1 and the second emitter terminal (E2), and the emitter resistor R3' of the transistor Tr3 is connected between the emitter of the transistor Tr3 and the second emitter terminal (E2'). The values of the resistors R1' and R3' are for example 150Ω.

The other structures are the same as FIG. 1. The layout of the connection terminals of the first and second semiconductor devices 200 and 300 shown in FIG. 3 is the same as the first and second semiconductor devices 20 and 30 (refer to FIG. 2).

As shown in FIG. 1, the oscillation suppressing resistors R7 and RB are connected between the final stage transistors Tr5 and Tr7 and the base circuit 50. In this case, works and spaces are required for mounting and connecting the oscillation suppressing resistors R7 and R8 to the printed circuit board 41. It is necessary for the safety purpose to use inflammable resistors as the resistors R7 and R8 connected to the printed circuit board 41. This inflammable resistor raises the cost. Since the base current of the transistor Tr1 as well as the bias current of the bias circuit 50 flows through the resistor R7, the voltage loss becomes large and an output voltage of the power amplifier lowers.

In contrast, in the modification shown in FIG. 3, the oscillation suppressing resistors R7' and R8' are built in the first and second semiconductor devices 200 and 300. Therefore, by mounting the first and second semiconductor devices 200 and 300 on the heat sink 8, the oscillation suppressing resistors R7' and R8' are automatically assembled and it is not necessary to externally connect expensive nonflammable resistors for oscillation suppression. Works and spaces for externally connecting such resistors on the printed circuit board can be dispensed with and the cost can be lowered.

Since the bias current will not flow through the resistors R7' and R8', the amount of current reduces and the voltage loss at the resistors R7' and R8' lowers. An output of the power amplifier can therefore be increased.

Figure 4:
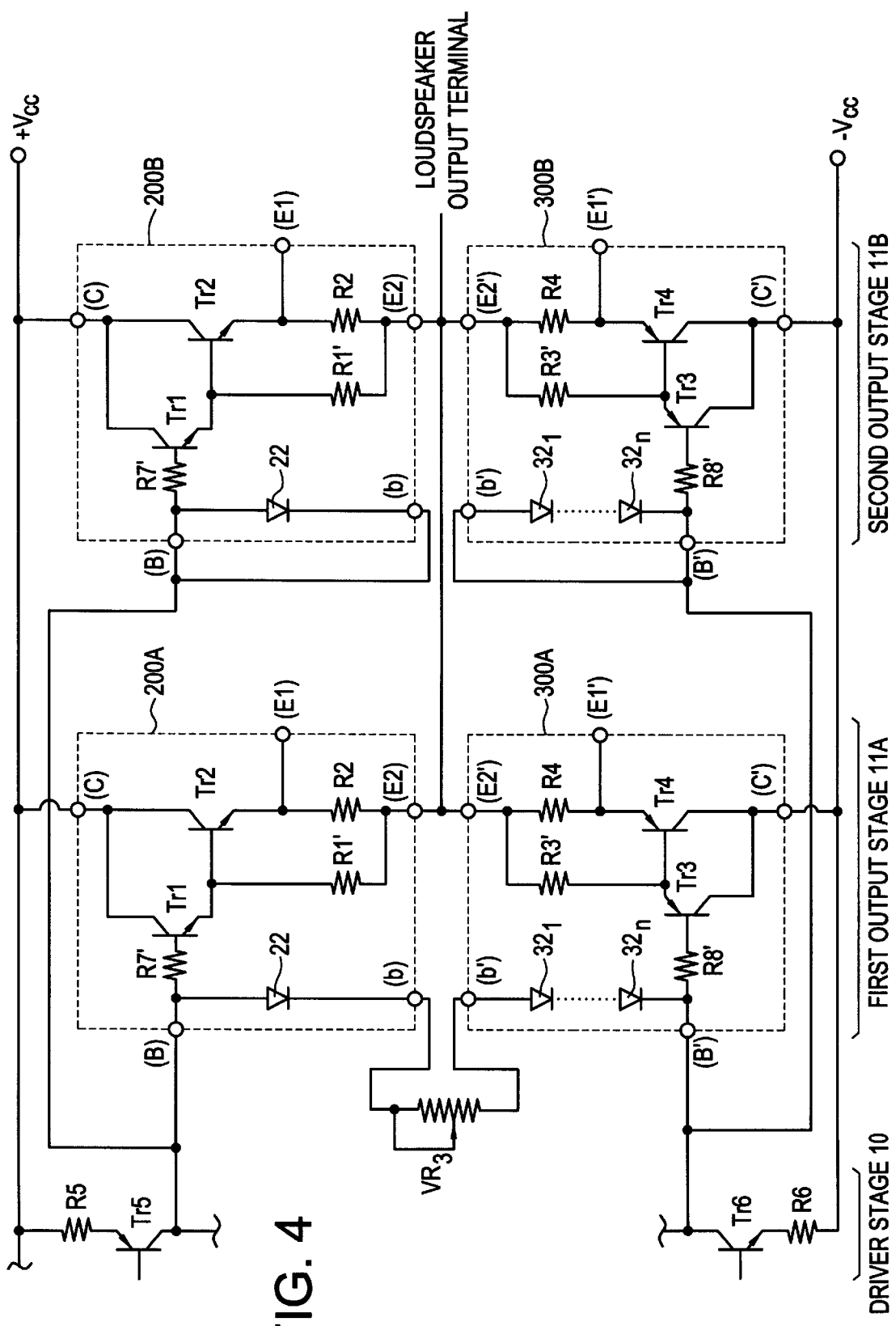
FIG. 4 is a circuit diagram showing the parallel push-pull structure of first and second semiconductor devices shown in FIG. 3.

In the case of the parallel push-pull structure such as shown in FIG. 4 in which a first output stage 11A constituted of SEPP connected first and second semiconductor devices 200A and 300A is connected in parallel with a second output stage 11B constituted of SEPP connected first and second semiconductor devices 200B and 300B, on the output side of the driver stage 10, the variable resistor $VR_3$ of the bias circuit is provided only to the first output stage 11A (both ends of the variable resistor $VR_3$ are connected to the bias terminal (b) of the first semiconductor device 200A and the bias terminal (b') of the second semiconductor device 300A). In the second output stage 11B, the bias terminal (b) of the first semiconductor device 200B is-connected to the base terminal (B), i.e., the diode 22 being shorted, and the bias terminal (b') of the second semiconductor device 300B is connected to the base terminal (B'), i.e., the diodes $32_1$ to $32_n$ being shorted. In this manner, a same proper bias voltage can be applied to the first and second output stages 11A and 11B so that only one variable resistor $VR_3$ is sufficient.

Figure 5:
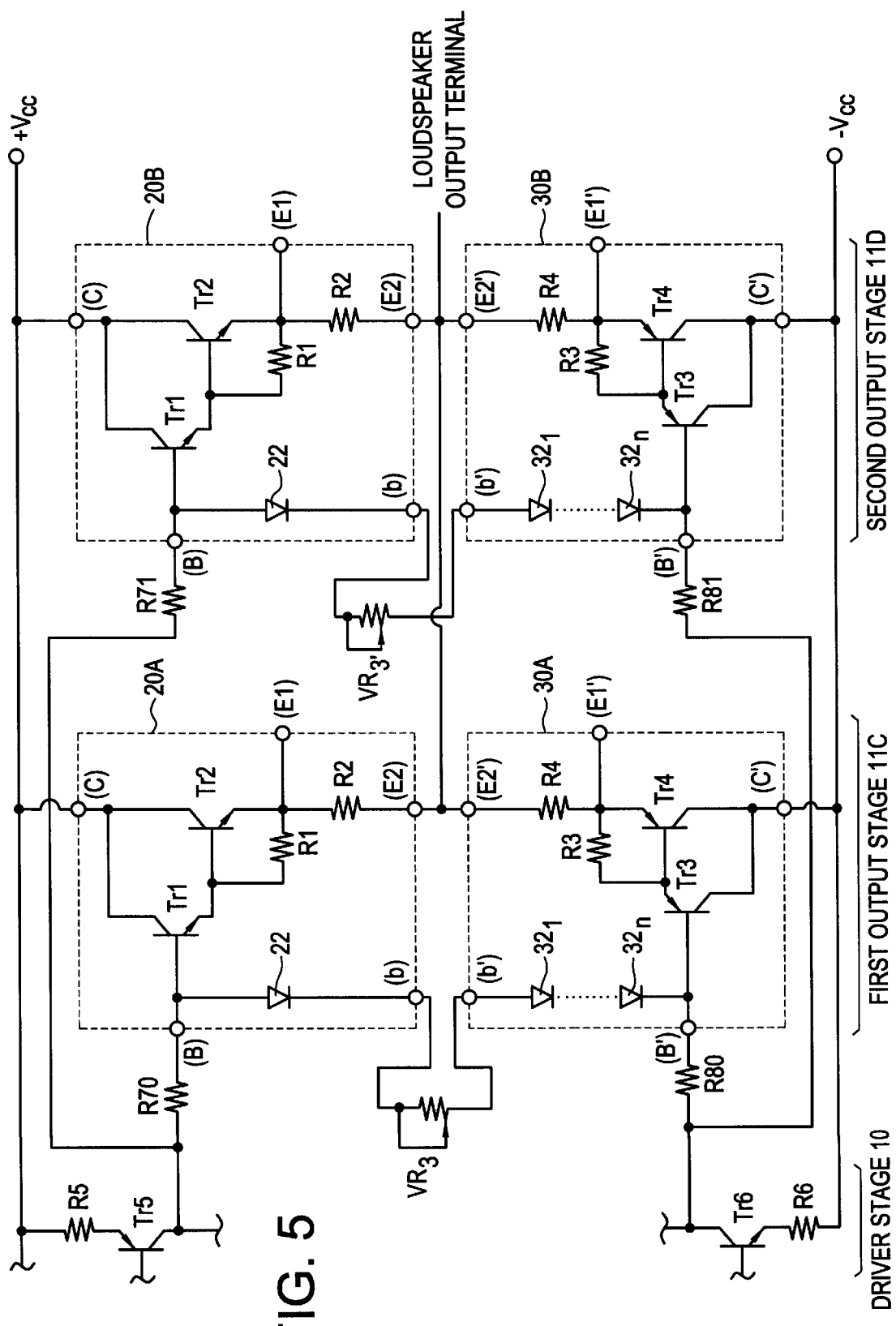
FIG. 5 is a circuit diagram showing the parallel push-pull structure of first and second semiconductor devices shown in FIG. 1.

In contrast, if the first and second semiconductor devices 20 and 30 shown in FIG. 1 are used for configuring the parallel push-pull structure, as shown in FIG. 5, a first output stage 11C constituted of SEPP connected first and second semiconductor devices 20A and 30A is connected in parallel with a second output stage 11D constituted of SEPP connected first and second semiconductor devices 20B and 30B, via oscillation suppressing resistors R70, R80, R71, and R81. In this case, in order to apply a same proper bias voltage to the first and second output stages 11C and 11D, it is necessary to provide the first and second output stages 11C and 11D with variable resistors $VR_3$ and $VR_3'$. Two variable resistors $VR_3$ and $VR_3'$ are therefore necessary.

Figure 6:
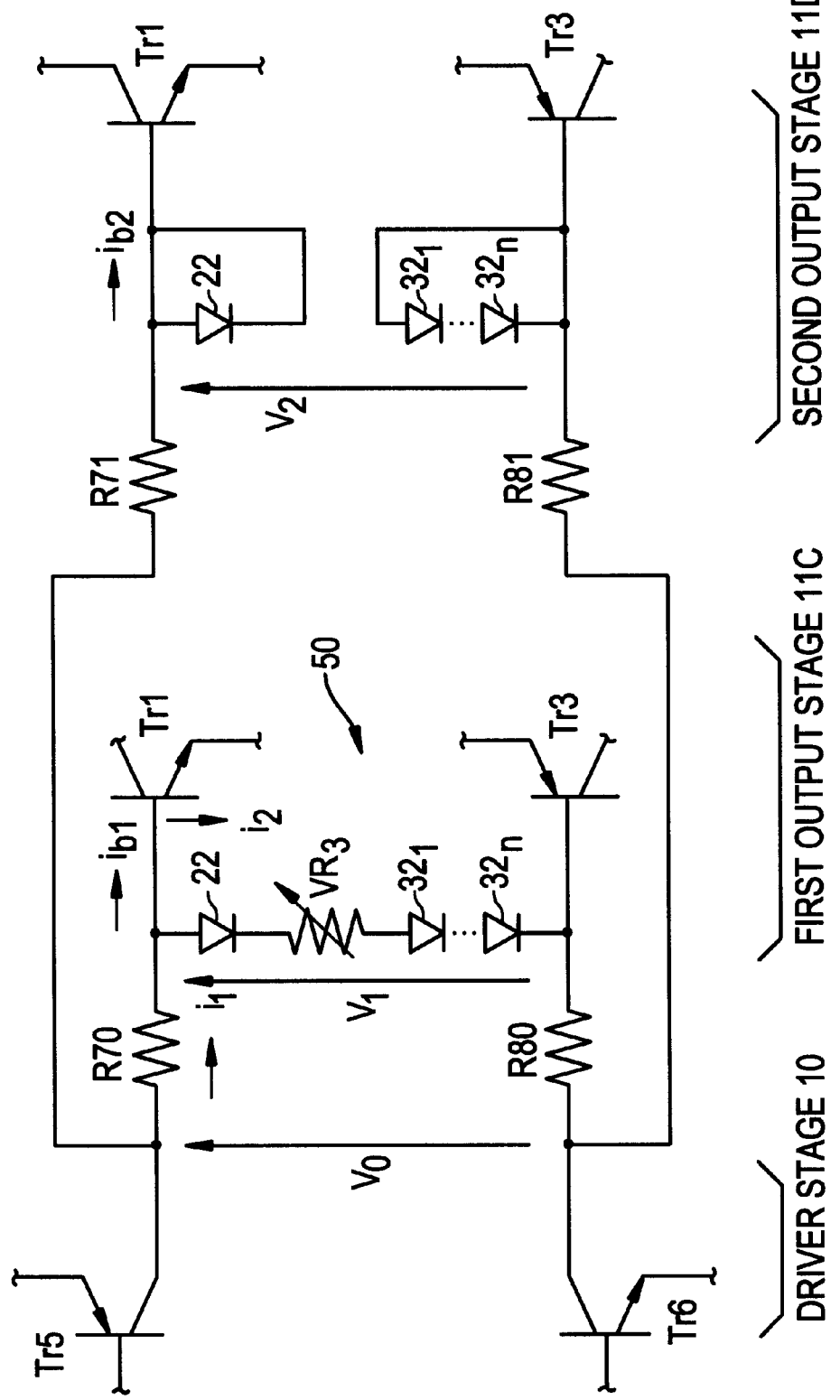
FIG. 6 is a diagram illustrating the operation of the circuit shown in FIG. 1 in which one of variable resistors is omitted.

If only the variable resistor $VR_3$ of the first output stage 11C same as FIG. 4 is used in the parallel push-pull structure using the first and second semiconductor devices 20 and 30 shown in FIG. 1, different bias voltages are applied to the first and second output stages 11C and 11D and an excessive load is applied to one of the first and second semiconductor devices 20 and 30 because of the following reasons. Referring to FIG. 6 in which the variable resistor $VR_3'$ shown in FIG. 5 is not used, the following relationship stands:

for the first output stage 11C $$V_0 = V_1 + 2R(i_{b1} + i_2) \quad (2),$$

and for the second output stage 11D $$V_0 = V_2 + 2R i_{b2} \quad (3)$$

where $V_0$ is an output voltage of the bias circuit 50, $i_1$ is a current flowing through the resistor R70, $V_1$ is a bias voltage of the bias circuit 50, $i_{b1}$ is a base current of the transistor Tr1 of the first output stage 11C, $V_2$ is a voltage between the bases of the second output stage 11D, and $R70=R80=R71=R81=R$.

From the equations (2) and (3), it stands:

$$V_1 + 2R(i_{b1} + i_2) = V_2 + 2R i_{b2}$$

Assuming that $i_{b1} = i_{b2} = i_b$, then:

$$V_1 + 2R i_b + 2R i_2 = V_2 + 2R i_b$$

Therefore:

$$V_1 + 2R i_2 = V_2$$

As above, different bias voltages are applied to the first and second output stages 11C and 11D.

Consider now the B-class operation of the output stage shown in FIG. 1. In this case, even if the polarity of an input signal from the driver stage 10 changes, for example, from plus to minus, the transistor Tr2 is not cut off immediately and a through current (broken line I in FIG. 1) flows with some delay from the transistor Tr2 to the transistor Tr4 of the second semiconductor device 30 via the emitter resistors R2 and R4, because it takes a finite time for carriers accumulated in the base of the transistor Tr2 of the first semiconductor device 20 to be discharged. If this through current is large, the transistors Tr2 and Tr4 may be broken at the worst.

In the first and second semiconductor devices 20 and 30 show in FIG. 1, the emitter resistor R1 of the transistor Tr1 of the NPN power transistor 21 is connected between the emitter of the transistor Tr1 and the emitter of the transistor Tr2, and the emitter resistor R3 of the transistor Tr3 of the PNP power transistor 31 is connected between the emitter of the transistor Tr3 and the emitter of the transistor Tr4. Therefore, the discharge path of carriers accumulated in the base of the transistor Tr2 is from the base of the transistor Tr2, resistor R1, resistor R2, resistor R4, resistor R3, and to the emitter of the transistor Tr3. As the through current I starts flowing, the reverse voltage is generated across the resistors R2 and R4 so that carriers accumulated in the base of the transistor Tr2 become difficult to be discharged (reverse voltage across the resistor R2 is 235 V when the through current I is 5 A).

Therefore, in the circuit shown in FIG. 1, cutting the transistor Tr2 off is delayed. A relatively large through current I may flow in the high frequency band, for example, 10 kHz or higher, or crossover distortion may be generated because of a delay in cutting the transistor Tr2 off.

In contrast, in the circuit shown in FIG. 3, the emitter resistor R1' of the transistor Tr1 is connected to the second emitter terminal (E) and the emitter resistor R3' of the transistor Tr3 is connected to the second emitter terminal (E'). Therefore, if the polarity of an input signal changed from plus to minus for example, the discharge path of carriers accumulated in the base of the transistor Tr2 is from the base of the transistor Tr2, resistor R1', resistor R3', and to the emitter of the transistor Tr3 (refer to a broken line i in FIG. 3). Therefore, a reverse voltage generated across the resistors R2 and R4 by the through current I is applied to the resistors R1' and R3' to promote discharge and the transistor Tr2 is cut off rapidly. As a result, crossover distortion is hard to be generated. Furthermore, since a large through current I is prevented from flowing from the transistor Tr2 to the transistor Tr4, it is possible to avoid breakage of these transistors Tr2 and Tr4.

Figure 7A:
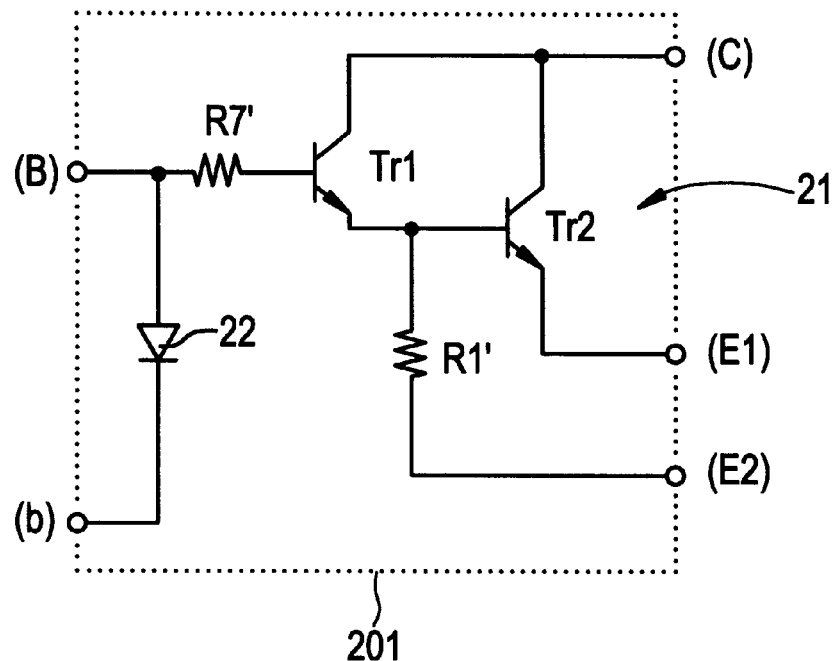
FIGS. 7A and 7B are circuit diagrams showing first and second semiconductor devices according to a modification of the semiconductor device shown in FIG. 3.
Figure 7B:
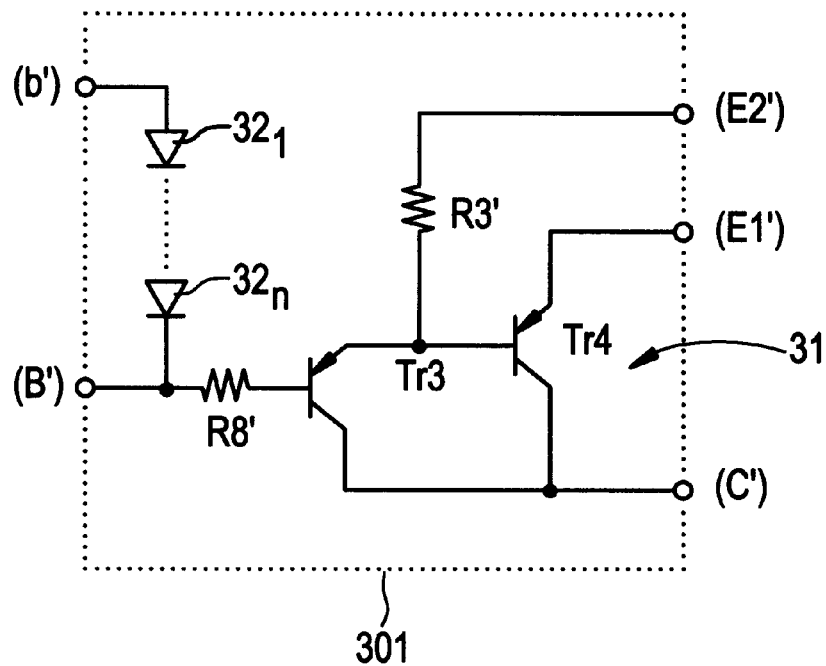

In the circuit shown in FIG. 3, the emitter resistors R2 and R4 of the transistors Tr2 and Tr4 are built in the first and second semiconductor devices 200 and 300. Another structure shown in FIGS. 7A and 7B may be used. Namely, in first and second semiconductor devices 201 and 301, emitter resistors R2 and R4 are omitted. The emitter of the transistor Tr2 is connected to the first emitter terminal (E1), and the emitter of the transistor Tr4 is connected to the first emitter terminal (E1'). The emitter resistor of the transistor Tr2 having a desired value may be externally connected between the first emitter terminal (E1) and the second emitter terminal (E2), whereas the emitter resistor of the transistor Tr4 having a desired value may be externally connected between the first emitter terminal (E1') and the second emitter terminal (E2,).

In the circuit shown in FIG. 3, the NPN and PNP power transistors 21 and 31 of the first and second semiconductor devices 200 and 300 are each constituted of two-stage Darlington connected transistors. A three-stage or higher stage structure may also be used. For example, as in the case of first and second semiconductor devices 202 and 203 shown in FIGS. 8A and 8B, an NPN power transistor 210 is constituted of three-stage Darlington connected transistors Tr20 to Tr22, and a PNP power transistor 310 is constituted of three-stage Darlington connected transistors Tr23 to Tr25. In this case, the emitters of the transistors Tr20 to Tr22 are connected via respective emitter resistors R20 to R22 to the second emitter terminal (E2), and the emitter of the final stage transistor Tr22 may be connected to the first emitter terminal (E1) to externally connect an additional emitter resistor to change the resistance value of the emitter resistor R22. Similarly, the emitters of the transistors Tr23 to Tr25 are connected via respective emitter resistors R23 to R25 to the second emitter terminal (E2'), and the emitter of the final stage transistor Tr25 may be connected to the first emitter terminal (E1.) to externally connect an additional emitter resistor to change the resistance value of the emitter resistor R25.

Figure 8A:
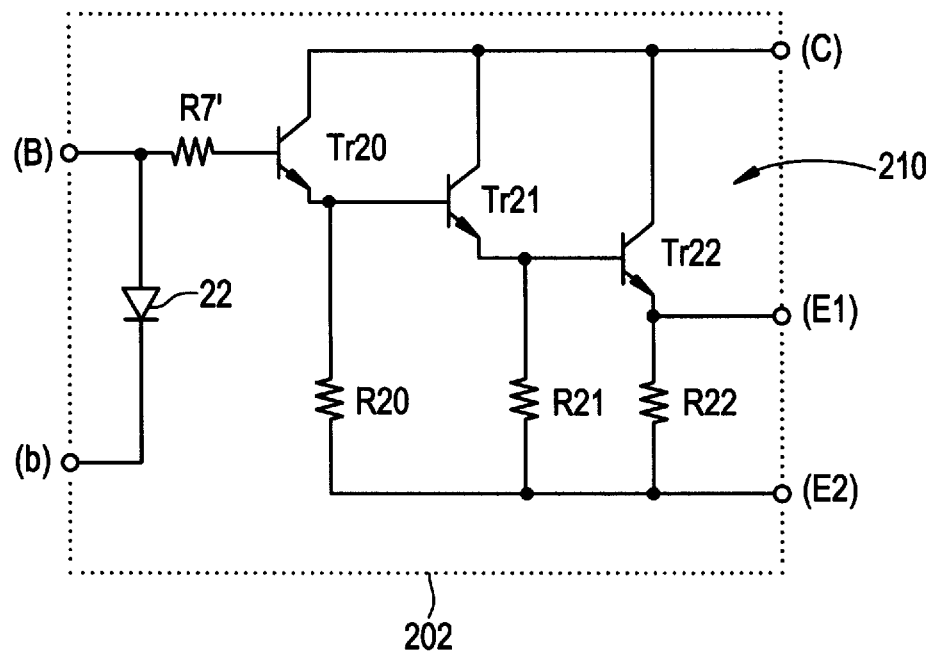
FIGS. 8A and 8B are circuit diagrams showing first and second semiconductor devices according to another modification of the semiconductor device shown in FIG. 3.
Figure 8B:
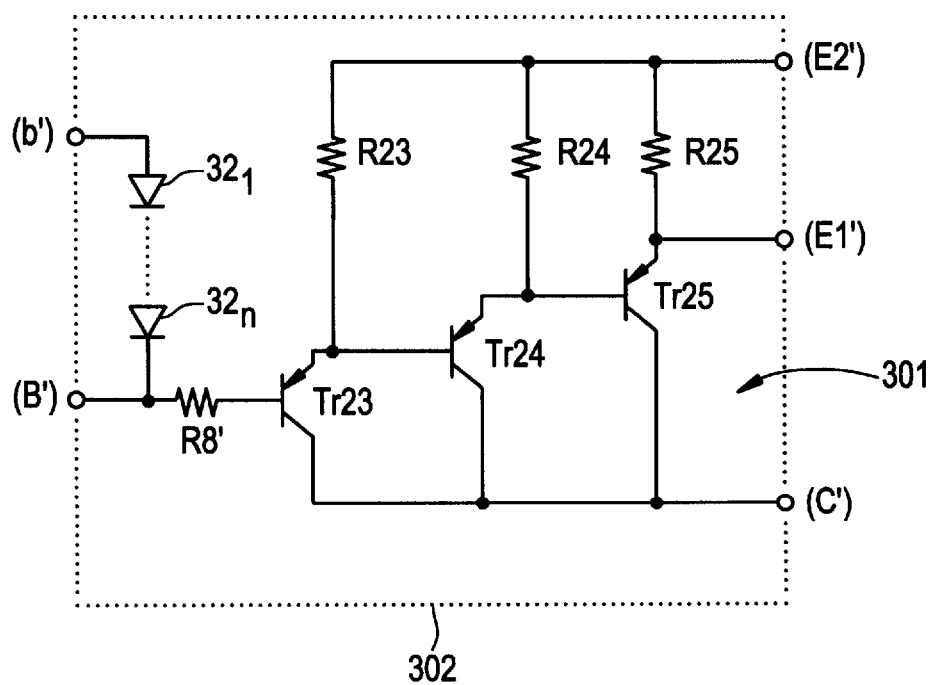

In the circuits shown in FIGS. 8A and 8B, if E is the total forward voltage drop between the bases and emitters of the NPN and PNP power transistors 210 and 310 and A is the temperature coefficient of E, then $E \approx 3.6V$ and $A = 3(\alpha_1 + \alpha_3)$. If B is the temperature coefficient of the forward voltage drop of the diodes $32_1$ to $32_n$ of the second semiconductor device 302, then $B \approx (A - \alpha_2)$, i.e., $$\alpha_{41} + \alpha_{42} + \ldots + \alpha_{4n} \approx 3(\alpha_1 + \alpha_3) - \alpha_2$$

For example, if the forward voltage drops $V_{G1}$ to $V_{Gn}$ of the diodes $32_1$ to $32_n$ are all the same and the temperature coefficients $\alpha_{41}$ to $\alpha_{4n}$ of $V_{Gi}$ to $V_{Gn}$ are all the same, then in the range of $0.1\text{ V} \leq V_{Gi} \leq 0.5\text{ V}$ $V_{Gi} \approx 2.6/n$ $\alpha_{4i} \approx (2\alpha_1 + 2\alpha_3 - \alpha_2)/n$ where $i=1-n$ If $n=5$ and $\alpha_1 = \alpha_3 = \alpha_2$, then $V_{Gi} \approx 2.6/5\text{V}$ and $\alpha_{4i} \approx \alpha_1$.

Figure 9A:
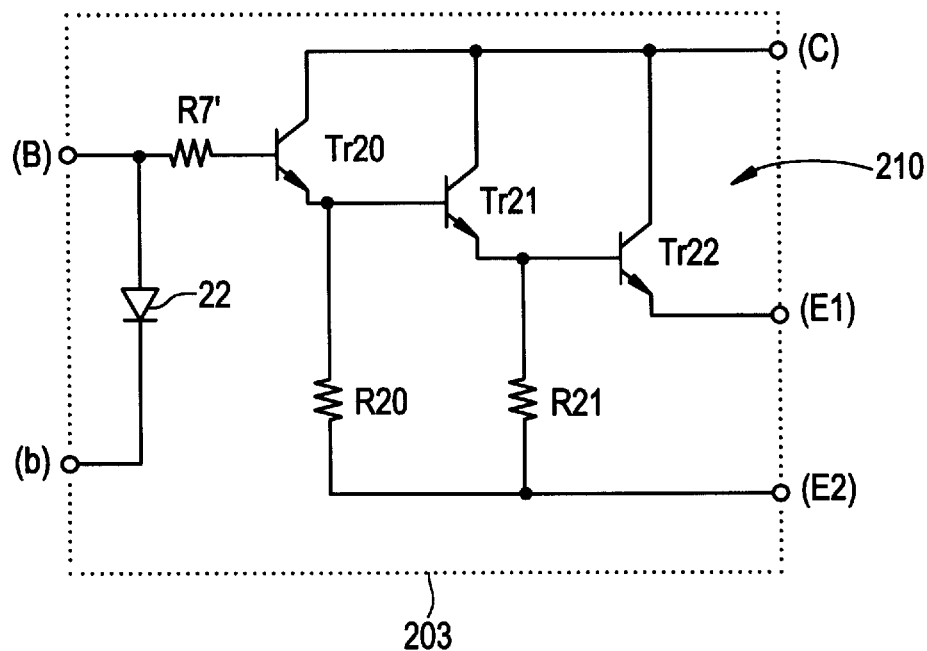
FIGS. 9A and 9B are circuit diagrams showing first and second semiconductor devices according to still another modification of the semiconductor device shown in FIG. 3.
Figure 9B:
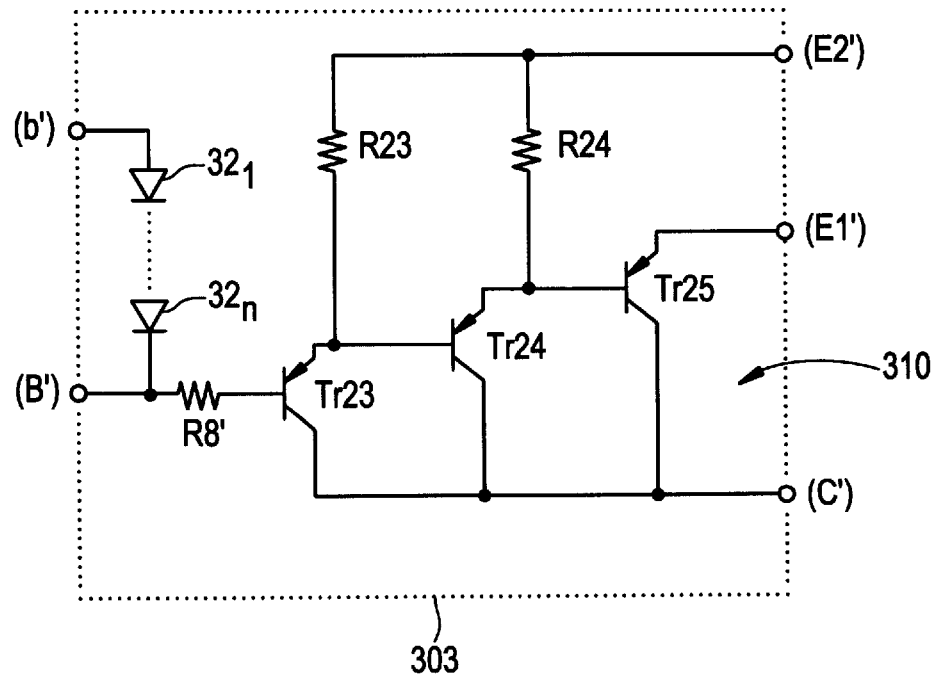

In the circuits shown in FIGS. 8A and 8B, the emitter resistors R22 and R25 of the transistors Tr2 and Tr4 are built in the first and second semiconductor devices 202 and 302. Another structure shown in FIGS. 9A and 9B may be used. Namely, in first and second semiconductor devices 203 and 303, emitter resistors R22 and R25 are omitted. The emitter of the transistor Tr22 is connected to the first emitter terminal (E1), and the emitter of the transistor Tr25 is connected to the first emitter terminal (E1'). The emitter resistor of the transistor Tr22 having a desired value may be externally connected between the first emitter terminal (E1) and the second emitter terminal (E2), whereas the emitter resistor of the transistor Tr25 having a desired value may be externally connected between the first emitter terminal (E1') and the second emitter terminal (E2,).

In the circuits shown in FIG. 3, FIGS. 7A to 9B, the base resistors R7' and R8' may be omitted.

Figure 10:
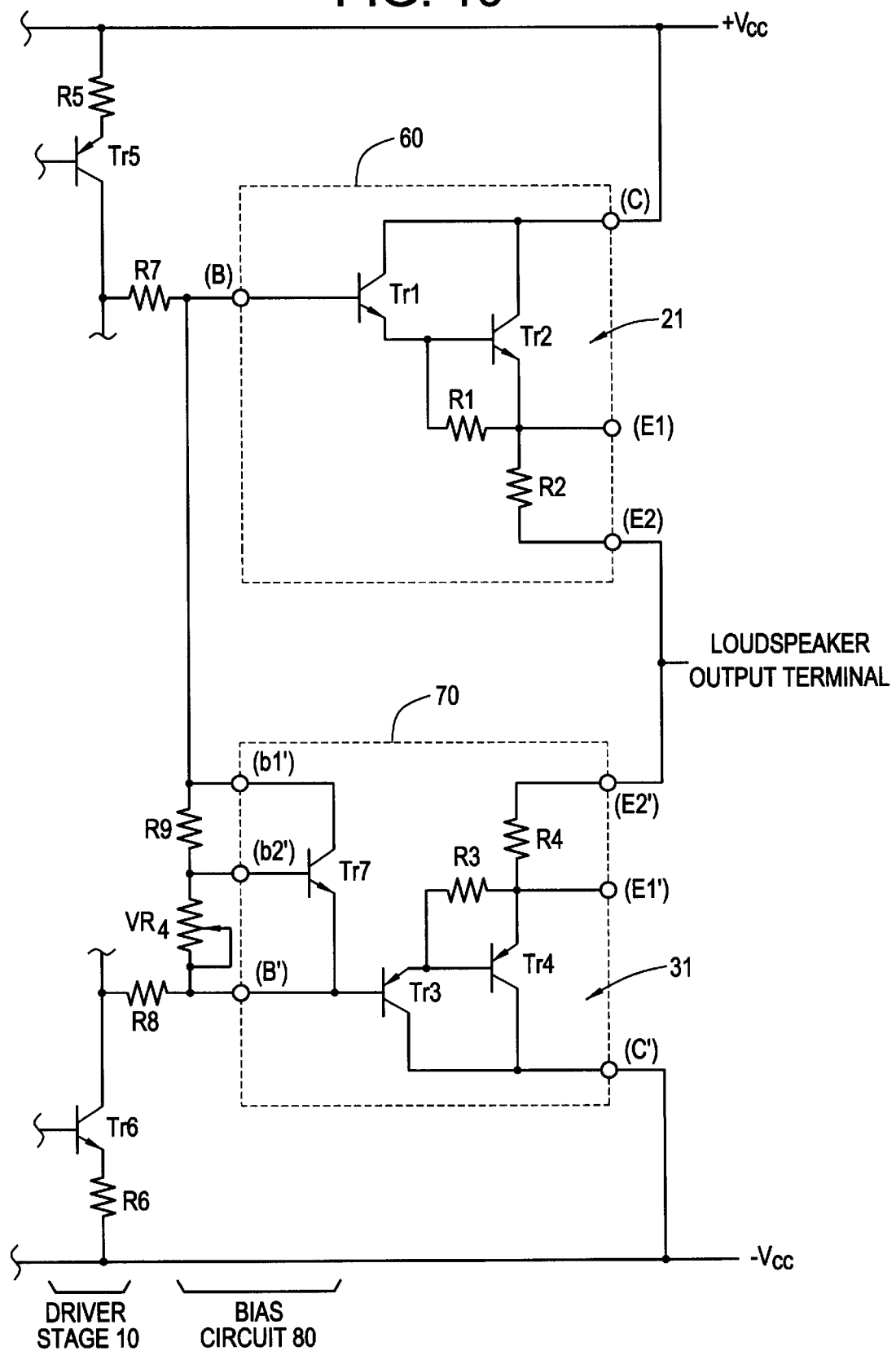
FIG. 10 is a circuit diagram showing the structure of a driver stage and an output stage of a power amplifier according to a second embodiment of the invention.

FIG. 10 is a circuit diagram showing the structure of a driver stage and an output stage of a power amplifier according to the second embodiment of the invention. In FIG. 10, like constituent elements to those shown in FIG. 1 are represented by identical reference symbols.

A first semiconductor device 60 has a structure that the diode 22 and bias terminal (b) of the first semiconductor device 20 shown in FIG. 1 are removed. A second semiconductor device 70 has an NPN transistor Tr7 of the bias circuit formed on the same semiconductor substrate as the PNP power transistor 31, in place of the diodes $32_1$ to $32_n$ of the second semiconductor device 30 shown in FIG. 1. The emitter of the transistor Tr7 is connected to the base (base of transistor Tr3) of the PNP power transistor 31 and to the external connection base terminal (B'), and the base and collector of the transistor Tr7 are connected to external connection bias terminals (b2') and (b1'), respectively.

The forward voltage drop $V_{BE}$ between the base and emitter of the bias transistor Tr7 is about 0.6 V, and its temperature coefficient $\alpha_5$ mV/° C. takes a negative value, and $\alpha_5 \approx \alpha_1$.

Figure 11:
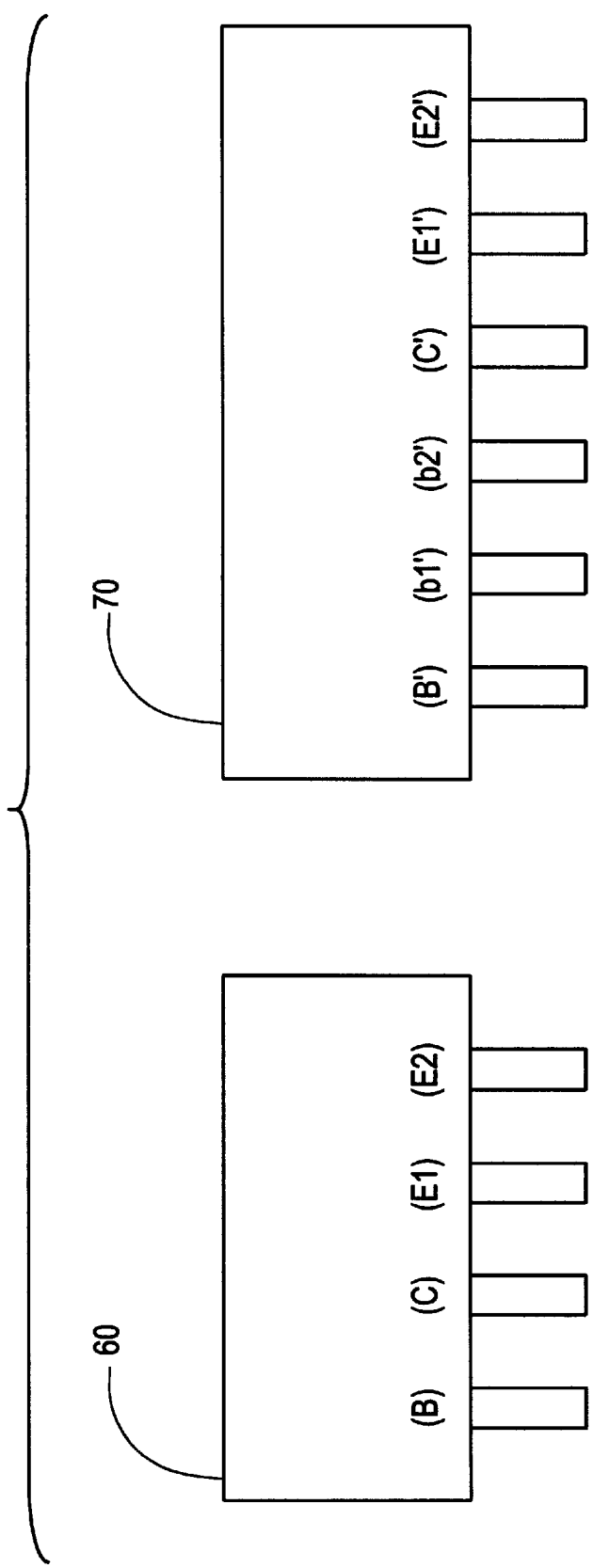
FIG. 11 is a diagram showing the layout of terminals of first and second semiconductor devices of the second embodiment shown in FIG. 10.

As shown in FIG. 11, when the first and second semiconductor devices 60 and 70 are juxtaposed side by side, the terminals (B), (C), (E1), and (E2) of the first semiconductor device 60 are symmetrical to the terminals (B'), (b1'), (b2'), (C'), (E1'), and (E2') of the second semiconductor device 70. Similar to the first embodiment, the printed patterns on the printed circuit board necessary for interconnections of the first or second emitter terminals, and collector terminals are made short.

The first and second semiconductor devices 60 and 70 having the matched electrical characteristics are SEPP connected and assembled in the manner same as the first embodiment except the bias circuit. The bias terminal (b1') of the second semiconductor device 70 is connected to the base terminal (B) of the first semiconductor device 60. Of an external resistor R9 and an external variable resistor $VR_4$ serially connected and constituting a voltage divider circuit, one end of the resistor R9 or one end of the voltage divider circuit is connected to the bias terminal (b1'), the voltage dividing point is connected to the bias terminal (b2'), and one end of the variable resistor $VR_4$ or the other end of the voltage divider circuit is connected to the base terminal (B'). The resistor R9, variable resistor $VR_4$, and transistor Tr7 constitute a bias circuit 80.

The other structures are quite the same as FIG. 1.

For the transistor type bias circuit 80, the variable resistor $VR_4$ is adjusted to set the vias voltage $V_{bias}$ to about E. In practice, the variable resistor $VR_4$ is adjusted so that the idling current takes a predetermined value at a predetermined high temperature.

According to the second embodiment, since it is easy to integrally form transistors on a semiconductor substrate, the component cost hardly rises. As the first and second semiconductor devices 60 and 70 are mounted on the heat sink, the transistor of the bias circuit for generating a proper bias voltage can be automatically mounted and the assembly works of the SEPP circuit can be simplified.

Since the bias transistor is formed on the same semiconductor substrate of the PNP power transistor of the second semiconductor device 70, ideal thermal coupling can be realized and good temperature compensation can be performed. If a combination of the complementary first and second semiconductor devices 60 and 70 is selected, the bias circuit transistor is automatically selected so that design of the SEPP circuit is simple.

Each of the first and second semiconductor devices 60 and 70 may be used as a conventional NPN or PNP power transistor.

The connection terminals are disposed so that when the first and second semiconductor devices 60 and 70 are juxtaposed side by side, first emitter terminals (E1) and (E1') and second emitter terminals (E2) and (E2') are positioned at the most inner side, and the collector terminals (C) and (C') are positioned at the second most inner side. Therefore, the printed patterns of the printed circuit board for the emitter and collector terminals necessary for the SEPP connection can be made short so that electromagnetic radiation is reduced and output distortion can be suppressed.

Since the emitter resistors R2 and R4 of the NPN and PNP power transistors are built in the first and second semiconductor devices 60 and 70, works and spaces for mounting the emitter resistors on the printed circuit board can be omitted.

One ends of the built-in emitter resistors R2 and R4 are connected to the second emitter terminals (E2) and (E2') different from the first emitter terminals (E1) and (E1'). Therefore, the emitter of the power transistor can be connected directly to an external circuit without being intervened by the built-in emitter resistor. In this case, the collector current of the power transistor can be monitored by measuring a voltage across the built-in emitter resistor, or another emitter resistor may be connected externally for changing the value of the built-in emitter resistor. The second emitter terminals (E2) and (E2') are positioned at the most inner side when the first and second semiconductor devices 60 and 70 are juxtaposed side by side. Therefore, in the standard case using the built-in emitter resistors, the second emitter terminals (E2) and (E2') can be interconnected by a shortest distance on the printed circuit board so that the length of the printed pattern for the loudspeaker output can be made shortest.

In the second embodiment, the fixed resistor R9 and variable resistor $VR_4$ are connected externally. Instead, if a variation of the electrical characteristics of the first and second semiconductor devices is small, the fixed resistor R9 for generating an optimum vias voltage may be formed in the second semiconductor device and connected to the bias transistor. In this manner, the bias voltage adjustment can be ultimately dispensed with and the adjustment work of the bias circuit after the assembly of the SEPP circuit becomes unnecessary.

Since the number of interconnections for the bias circuit on the printed circuit board can be reduced, the mount area reduces. Therefore, the printed patterns of for the emitter and collector terminals to be formed on the printed circuit board for the SEPP connection can be shortened so that electromagnetic radiation is reduced and the generation of output distortion can be suppressed.

The bias transistor may use a PNP transistor and may be formed in the first semiconductor device.

The conditions of $\alpha_5 \approx \alpha_1$ are not necessary to be strictly satisfied, but if both the values are not so much different, the temperature compensation near ideal state is possible.

Figure 12:
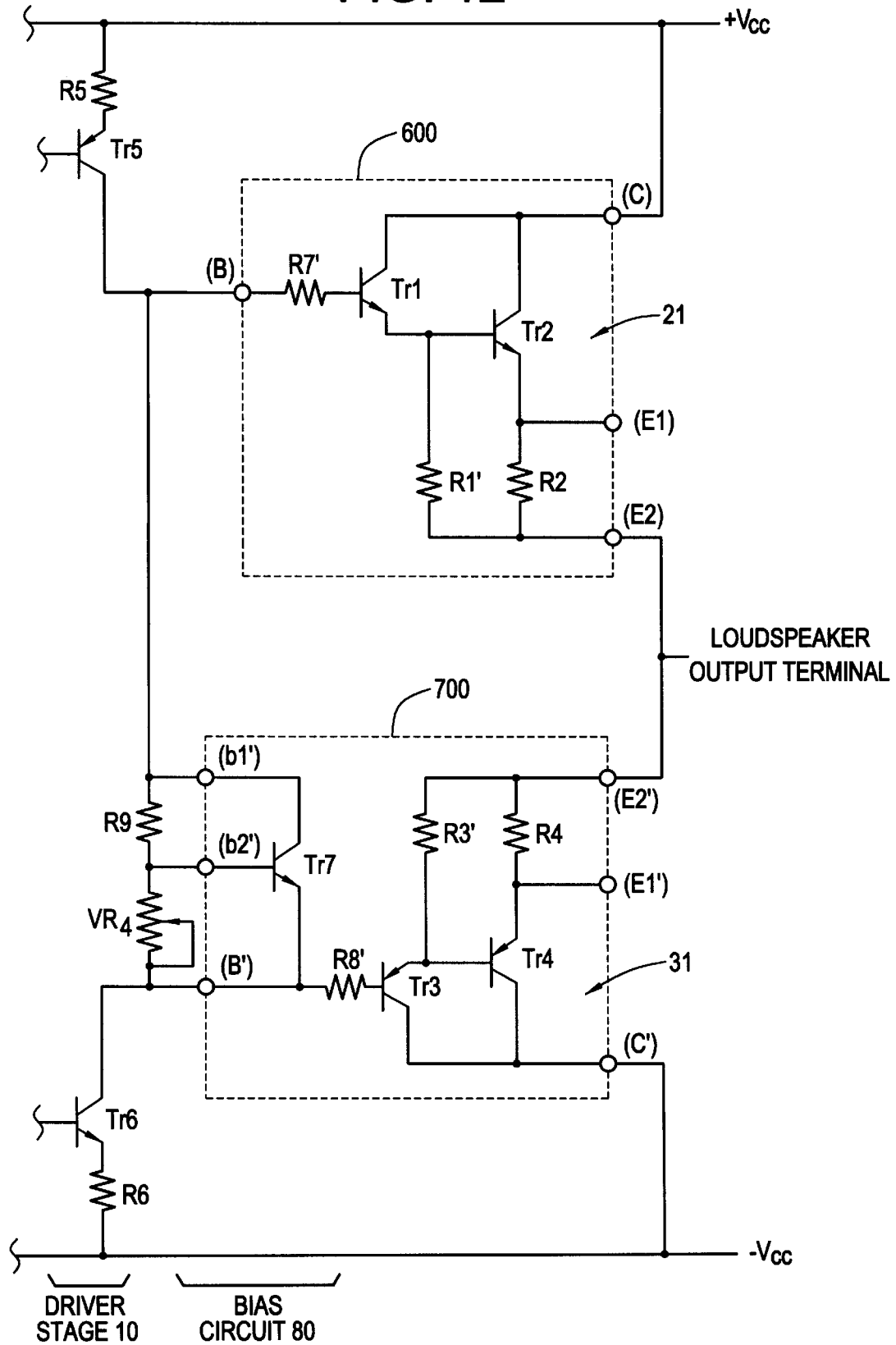
FIG. 12 is a circuit diagram showing the structure of a driver stage and an output stage of a power amplifier according to a modification of the second embodiment shown in FIG. 10.
Figure 13:
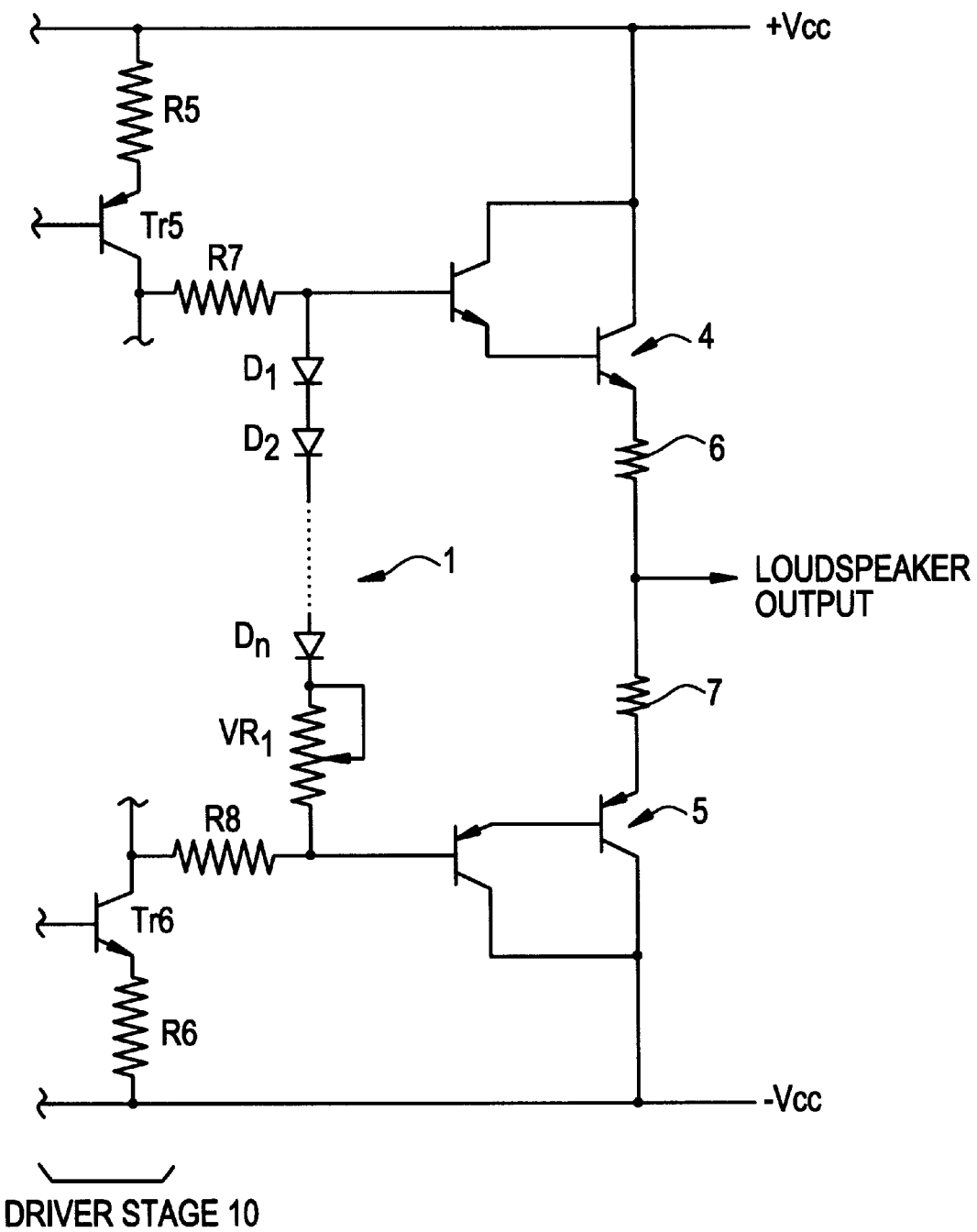
FIG. 13 is a circuit diagram showing a power amplifier output stage having a conventional diode type bias circuit.
Figure 14:
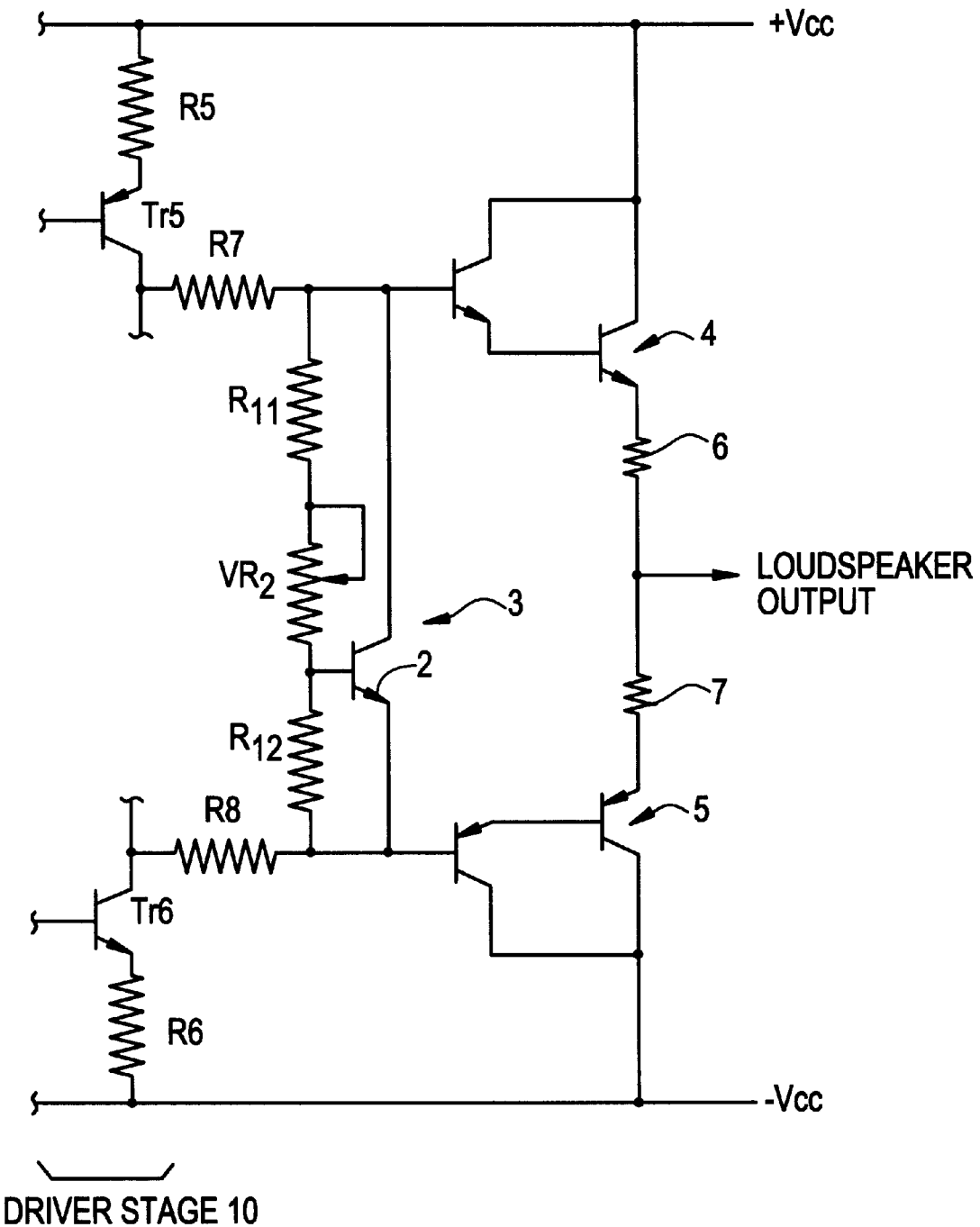
FIG. 14 is a circuit diagram showing a power amplifier output stage having a conventional transistor type bias circuit.

FIG. 12 is a circuit diagram showing the structure of a driver stage and an output stage of a power amplifier according to a modification of the circuit shown in FIG. 10. In FIG. 12, like constituent elements to those shown in FIG. 10 are represented by identical reference symbols.

In the embodiment shown in FIG. 10, the oscillation suppressing resistors R7 and R8 are connected between the final stage transistors Tr5 and Tr6 of the driver stage 10 and the bias circuit 80. In this modification shown in FIG. 12, an oscillation suppressing base resistor R7' is connected between the base terminal (B) and the base of the transistor Tr1 of a first semiconductor device 600, and an oscillation suppressing base resistor R8' is connected between the base terminal (B') and the base of the transistor Tr3 of a second semiconductor device 700. The values of the base resistors R7' and R8' are about several Ω to several hundreds Ω, for example, 47Ω.

In the embodiment shown in FIG. 10, the emitter resistor R1 of the transistor Tr1 of the NPN power transistor 21 is connected between the emitters of the transistors Tr1 and Tr2, and the emitter resistor R3 of the transistor Tr3 of the PNP power transistor 31 is connected between the emitters of the transistors Tr3 and Tr4. In the modification shown in FIG. 12, the emitter resistor R1' of the transistor Tr1 is connected between the emitter of the transistor Tr1 and the second emitter terminal (E2), and the emitter resistor R3' of the transistor Tr3 is connected between the emitter of the transistor Tr3 and the second emitter terminal (E2'). The values of the resistors R1' and R3' are about 100 to 200Ω, for example 150Ω.

The other structures are the same as FIG. 10. The layout of the connection terminals of the first and second semiconductor devices 600 and 700 shown in FIG. 12 is the same as the first and second semiconductor devices 60 and 70 (refer to FIG. 11).

In the modification shown in FIG. 12, the oscillation suppressing resistors R7' and R8' are built in the first and second semiconductor devices 600 and 700. Therefore, by mounting the first and second semiconductor devices 600 and 700 on the heat sink, the oscillation suppressing resistors R7' and R8' are automatically assembled and it is not necessary to externally connect expensive inflammable resistors for oscillation suppression. Works and spaces for externally connecting such resistors on the printed circuit board can be dispensed with and the cost can be lowered.

Since the bias current will not flow through the resistors R7' and R8', the amount of current reduces and the voltage loss at the resistors R7' and R8' lowers. An output of the power amplifier can therefore be increased.

In the circuit shown in FIG. 12, the emitter resistor R11 of the transistor Tr1 is connected to the second emitter terminal (E) and the emitter resistor R3' of the transistor Tr3 is connected to the second emitter terminal (E'). Therefore, if the polarity of an input signal changed from plus to minus for example, the discharge path of carriers accumulated in the base of the transistor Tr2 is from the base of the transistor Tr2, resistor R1, resistor R3', and to the emitter of the transistor Tr3. Therefore, a reverse voltage generated across the resistors R2 and R4 by the through current is applied to the resistors R1 and R3' to promote discharge and the transistor Tr2 is cut off rapidly. As a result, crossover distortion is hard to be generated. Furthermore, since a large through current is prevented from flowing from the transistor Tr2 to the transistor Tr4, it is possible to avoid breakage of these transistors Tr2 and Tr4.

In configuring the parallel push-pull circuit similar to FIG. 4 by using two pairs of the first and second semiconductor devices 60 and 70 shown in FIG. 12, one voltage divider circuit of the bias circuit is used only by one of the two SEPP circuits because the oscillation suppressing base resistors R7' and R8' are built in the first and second semiconductor devices 600 and 700.

In the circuit shown in FIG. 12, the emitter resistors R2 and R4 built in the first and second semiconductor devices 600 and 700 may be omitted. In this case, the emitter of the transistor Tr2 is connected to the first emitter terminal (E1) and the emitter of the transistor Tr4 is connected to the first emitter terminal (E1').

The NPN and PNP power transistors 21 and 31 may be replaced by Darlington connected transistors of a three-stage or higher stage structure. In this case, the emitters of the Darlington connected transistors may be connected via respective emitter resistors to the second emitter terminals (E2) and (E2'), or the emitters other than the final stage may be connected via respective emitter resistors to the second emitter terminals (E2) and (E2') and the emitters of the last stage transistors are connected directly to the first emitter terminals (E1) and p According to the present invention, The total forward voltage drop $V_1$ of the bias circuit diode or diodes of one of the first and second semiconductor devices is set to an arbitrary constant value smaller than E exclusive of about E/2, where E is a total forward voltage drop between the bases and emitters of the NPN and PNP power transistors of the first and second semiconductor devices. It is therefore possible to form an ordinary diode such as a PN junction diode on the same semiconductor substrate as the NPN or PNP power transistor. The manufacture is therefore easy and cost effective. The bias circuit diode of the other of the first and second semiconductor devices uses a Schottky barrier diode. Therefore, the forward voltage drop per one diode can be set finely in the range from 0.1 to 0.5 V, by using relatively simple structure. The total forward voltage drop $V_2$ of the diodes can be easily set to a predetermined value of about $(E-V_1)$. As a result, only by mounting the first and second semiconductor devices on a heat sink, the diodes of a bias circuit for generating a proper bias voltage can be automatically mounted and the assembly work of the SEPP circuit can be simplified. Since Schottky diodes are used only for one of the first and second semiconductor devices, a rise of component cost is small.

The diodes of the first and second semiconductor devices are formed on the same semiconductor substrate as the NPN or PNP power transistor. Accordingly, ideal thermal coupling can be realized and good temperature compensation can be performed.

If a combination of the complementary first and second semiconductor devices is selected, the bias circuit diodes are automatically selected so that design of the SEPP circuit is simple.

Each of the first and second semiconductor devices may be used as a conventional NPN or PNP power transistor.

The bias circuit transistor for SEPP connection is formed on the semiconductor substrate same as the NPN or PNP power transistor of the first or second semiconductor device.

Therefore, as the first and second semiconductor devices are mounted on a heat sink, the transistor of the bias circuit for generating a proper bias voltage can be automatically mounted and the assembly works of the SEPP circuit can be simplified.

Since the bias transistor is formed on the same semiconductor substrate as the NPN or PNP power transistor of the first or second semiconductor device, ideal thermal coupling can be realized and good temperature compensation can be performed.

If a combination of the complementary first and second semiconductor devices is selected, the bias circuit transistor is automatically selected so that design of the SEPP circuit is simple.

Transistors can be formed on a semiconductor substrate very easily so that the component cost hardly rises.

Each of the first and second semiconductor devices may be used as a conventional NPN or PNP power transistor.

What is claimed is:

1. A semiconductor device comprising:
    a first semiconductor device having an NPN power transistor formed on a first semiconductor substrate; and
    a second semiconductor device having a PNP power transistor complementary to the NPN power transistor formed on a second semiconductor substrate,
    said first and second semiconductor devices capable of being SEPP connected, said first semiconductor device having one or a plurality of serially connected bias circuit diodes formed on the first semiconductor device, the anode side of the diode or diodes being connected to the base of the NPN power transistor and the cathode side thereof being connected to a first bias terminal, said second semiconductor device having one or a plurality of serially connected bias circuit diodes formed on the second semiconductor device, the cathode side of the diode or diodes being connected to the base of the PNP power transistor and the anode side thereof being connected to a second bias terminal, wherein:
        the total forward voltage drop $V_1$ of the bias circuit diode or diodes of one of said first and second semiconductor devices is set to an arbitrary constant value smaller than E exclusive of about E/2; and
        the bias circuit diode or diodes of the other of said first and second semiconductor devices are Schottky barrier diodes and the total forward voltage drop $V_2$ of the bias diode or diodes is set to a predetermined value of about $(E - V_1)$, where E is a total forward voltage drop between the bases and emitters of the NPN and PNP power transistors of said first and second semiconductor devices.

2. A semiconductor device according to claim 1, wherein a bias voltage adjusting resistor is serially connected to the bias circuit diode or diodes of said first or second semiconductor device.

3. A semiconductor device according to claim 1 or 2, wherein:
    said first semiconductor device includes a base terminal, a collector terminal, and an emitter terminal respectively connected to the base, collector, and emitter sides of the NPN power transistor; and
    said second semiconductor device includes a base terminal, a collector terminal, and an emitter terminal respectively connected to the base, collector, and emitter sides of the PNP power transistor, and wherein
    the terminals are disposed so that when said first and second semiconductor devices are juxtaposed side by side, the emitter terminals are positioned at the most inner side and the collector terminals are positioned at the second most inner side.

4. A semiconductor device according to claim 3, wherein:
    an emitter resistor is connected between the emitter terminal and the emitter of the NPN power transistor of said first semiconductor device; and
    an emitter resistor is connected between the emitter terminal and the emitter of the PNP power transistor of said second semiconductor device.

5. A semiconductor device according to claim 1, wherein:
    an emitter resistor is connected at one end to the emitter of the NPN power transistor of said first semiconductor device, the other end thereof being connected to a second emitter terminal; and
    an emitter resistor is connected at one end to the emitter of the PNP power transistor of said second semiconductor device, the other end thereof being connected to a second emitter terminal, wherein
    when said first and second semiconductor devices are juxtaposed side by side, the second emitter terminals are positioned more inner than emitter terminals.

6. A semiconductor device according to claim 1 or 2, wherein:
    the anode side of the bias circuit diode or diodes of said first semiconductor device is connected to a base terminal, a base resistor being connected between the anode side and the base of the NPN power transistor; and
    the cathode side of the bias circuit diode or diodes of said second semiconductor device is connected to a base terminal, a base resistor being connected between the cathode side and the base of the PNP power transistor.

7. A semiconductor device according to claim 6, wherein:
    said first semiconductor device includes a collector terminal and an emitter terminal respectively connected to the collector and emitter sides of the NPN power transistor; and
    said second semiconductor device includes a collector terminal and an emitter terminal respectively connected to the collector and emitter sides of the PNP power transistor, and wherein
    the terminals are disposed so that when said first and second semiconductor devices are juxtaposed side by side, the emitter terminals are positioned at the most inner side and the collector terminals are positioned at the second most inner side.

8. A semiconductor device according to claim 7, wherein:
    an emitter resistor is connected between the emitter terminal and the emitter of the NPN power transistor of said first semiconductor device; and
    an emitter resistor is connected between the emitter terminal and the emitter of the PNP power transistor of said second semiconductor device.

9. A semiconductor device according to claim 7, wherein:
    an emitter resistor is connected at one end to the emitter of the NPN power transistor of said first semiconductor device, the other end thereof being connected to a second emitter terminal; and
    an emitter resistor is connected at one end to the emitter of the PNP power transistor of said second semiconductor device, the other end thereof being connected to a second emitter terminal, wherein
    when said first and second semiconductor devices are juxtaposed side by side, the second emitter terminals are positioned more inner than emitter terminals.

10. A semiconductor device according to claim 1 or 2, wherein:

the NPN power transistor of said first semiconductor device includes Darlington connected n-stage NPN transistors, the emitter of each of n-stage NPN transistors being connected via an emitter resistor to an emitter terminal; and the PNP power transistor of said second semiconductor device includes Darlington connected n-stage PNP transistors, the emitter of each of n-stage PNP transistors being connected via an emitter resistor to an emitter terminal.

11. A semiconductor device according to claim 10, wherein:

said first semiconductor device includes a base terminal and a collector terminal respectively connected to the base and collector sides of the NPN power transistor; and said second semiconductor device includes a base terminal and a collector terminal respectively connected to the base and collector sides of the PNP power transistor, and wherein the terminals are disposed so that when said first and second semiconductor devices are juxtaposed side by side, the emitter terminals are positioned at the most inner side and the collector terminals are positioned at the second most inner side.

12. A semiconductor device according to claim 1 or 2, wherein:

the NPN power transistor of said first semiconductor device includes Darlington connected n-stage NPN transistors, the emitter of the last stage NPN transistor being connected to a first emitter terminal and the base of each of the second and following stage NPN transistors being connected via an emitter resistor to a second emitter terminal; and the PNP power transistor of said second semiconductor device includes Darlington connected n-stage PNP transistors, the emitter of the last stage PNP transistor being connected to a first emitter terminal and the base of each of the second and following stage PNP transistors being connected via an emitter resistor to a second emitter terminal.

13. A semiconductor device according to claim 12, wherein:

said first semiconductor device includes a base terminal and a collector terminal respectively connected to the base and collector sides of the NPN power transistor; and said second semiconductor device includes a base terminal and a collector terminal respectively connected to the base and collector sides of the PNP power transistor, and wherein the terminals are disposed so that when said first and second semiconductor devices are juxtaposed side by side, the second emitter terminals are positioned at the most inner side, the first emitter terminals are positioned at the second most inner side, and the collector terminals are positioned at the third most inner side.

14. A semiconductor device comprising:

a first semiconductor device having an NPN power transistor formed on a first semiconductor substrate; a second semiconductor device having a PNP power transistor complementary to the NPN power transistor formed on a second semiconductor substrate, said first and second semiconductor devices capable of being SEPP connected; and a bias circuit transistor for SEPP connection formed on the same semiconductor substrate as the NPN or PNP power transistor of said first or second semiconductor device, the collector and emitter of said bias circuit transistor being connected across the base of the NPN or PNP power transistor and a bias terminal, and the connection point to the base of the NPN or PNP power transistor being connected to a base terminal.

15. A semiconductor device according to claim 14, wherein said first or second semiconductor device formed with said bias circuit transistor is provided with a voltage divider circuit made of resistors, opposite ends of the voltage divider circuit are connected in parallel across the collector and emitter of the bias circuit transistor, and a voltage division point is connected to the base of the bias circuit transistor.

16. A semiconductor device according to claim 14 or 15, wherein:

said first semiconductor device includes a collector terminal and an emitter terminal respectively connected to the collector side and the emitter side of the NPN power transistor; and said second semiconductor device includes a collector terminal and an emitter terminal respectively connected to the collector side and the emitter side of the PNP power transistor, wherein when said first and second semiconductor devices are juxtaposed side by side, the terminals are disposed so that the emitter terminals are positioned at the most inner side and the collector terminals are positioned at the next most inner side.

17. A semiconductor device according to claim 16, wherein:

an emitter resistor is connected between the emitter of the NPN power transistor and the emitter terminal of said first semiconductor device; and an emitter resistor is connected between the emitter of the PNP power transistor and the emitter terminal of said second semiconductor device.

18. A semiconductor device according to claim 16, wherein:

an emitter resistor is connected at one end to the emitter of the NPN power transistor of said first semiconductor device, the other end of the emitter resistor being connected to a second emitter terminal formed on said first semiconductor device;

an emitter resistor is connected at one end to the emitter of the PNP power transistor of said second semiconductor device, the other end of the emitter resistor being connected to a second emitter terminal formed on said second semiconductor device, wherein when said first and second semiconductor devices are juxtaposed side by side, the terminals are disposed so that the second emitter terminals are positioned more inner than the emitter terminals.

19. A semiconductor device according to claim 14 or 15, wherein:

said first or second semiconductor device with a built-in bias circuit resistor has a base resistor connected between the emitter or collector of the built-in bias circuit connected to the base terminal and the base of the NPN or PNP power transistor; and said first or second semiconductor device without a built-in bias circuit resistor has a base resistor connected between the base of the NPN or PNP power transistor and the base terminal.

20. A semiconductor device according to claim 19, wherein:

in said first or second semiconductor device with a built-in bias circuit resistor, the collector side and the emitter side of the NPN or PNP power transistor are connected respectively to a collector terminal and an emitter terminal; and in said first or second semiconductor device without a built-in bias circuit resistor, the collector side and the emitter side of the NPN or PNP power transistor are connected respectively to a collector terminal and an emitter terminal, wherein when said first and second semiconductor devices are juxtaposed side by side, the terminals are disposed so that the emitter terminals are positioned at the most inner side and the collector terminals are positioned at the next most inner side.

21. A semiconductor device according to claim 20, wherein:

an emitter resistor is connected between the emitter of the NPN power transistor and the emitter terminal of said first semiconductor device; and an emitter resistor is connected between the emitter of the PNP power transistor and the emitter terminal of said second semiconductor device.

22. A semiconductor device according to claim 20, wherein:

an emitter resistor is connected at one end to the emitter of the NPN power transistor of said first semiconductor device, the other end of the emitter resistor being connected to a second emitter terminal formed on said first semiconductor device;

an emitter resistor is connected at one end to the emitter of the PNP power transistor of said second semiconductor device, the other end of the emitter resistor being connected to a second emitter terminal formed on said second semiconductor device, wherein when said first and second semiconductor devices are juxtaposed side by side, the terminals are disposed so that the second emitter terminals are positioned more inner than the emitter terminals.

23. A semiconductor device according to claim 14 or 15, wherein:

the NPN power transistor of said first semiconductor device includes n-stage Darlington connected NPN transistors whose emitters are connected via respective emitter resistors to an emitter terminal; and the PNP power transistor of said second semiconductor device includes n-stage Darlington connected NPN transistors whose emitters are connected via respective emitter resistors to an emitter terminal.

24. A semiconductor device according to claim 23, wherein:

said first semiconductor device includes a base terminal and a collector terminal respectively connected to the base and collector sides of the NPN power transistor; and said second semiconductor device includes a base terminal and a collector terminal respectively connected to the base and collector sides of the PNP power transistor, and wherein the terminals are disposed so that when said first and second semiconductor devices are juxtaposed side by side, the emitter terminals are positioned at the most inner side and the collector terminals are positioned at the second most inner side.

25. A semiconductor device according to claim 14 or 15, wherein:

the NPN power transistor of said first semiconductor device includes n-stage Darlington connected NPN transistors, the emitter of the last stage NPN transistor is connected to a first emitter terminal, and the bases of the other NPN transistors at the second and following stages are connected via respective emitter resistors to a second emitter terminal; and the PNP power transistor of said second semiconductor device includes n-stage Darlington connected PNP transistors, the emitter of the last stage PNP transistor is connected to a first emitter terminal, and the bases of the other PNP transistors at the second and following stages are connected via respective emitter resistors to a second emitter terminal.

26. A semiconductor device according to claim 25, wherein:

said first semiconductor device includes a base terminal and a collector terminal respectively connected to the base and collector sides of the NPN power transistor; and said second semiconductor device includes a base terminal and a collector terminal respectively connected to the base and collector sides of the PNP power transistor, and wherein the terminals are disposed so that when said first and second semiconductor devices are juxtaposed side by side, the first emitter terminals are positioned at the most inner side, the second emitter terminals are positioned at the second most inner side, and the collector terminals are positioned at the third most inner side.

* * * * *